US007152473B1

(12) United States Patent
Rushefsky et al.

(10) Patent No.: US 7,152,473 B1
(45) Date of Patent: Dec. 26, 2006

(54) INTEGRATED AND MULTI-AXIS SENSOR ASSEMBLY AND PACKAGING

(75) Inventors: Larry Rushefsky, Sugar Land, TX (US); Axel Sigmar, Lago Vista, TX (US); Howard D. Goldberg, Sugar Land, TX (US); W. Marc Stalnaker, Sugar Land, TX (US); Ray Rinne, Raleigh, NC (US); Demetrios Balderes, Poughkeepsie, NY (US); Guido Lemke, Hopewell Jct, NY (US); Matthew Ip, Austin, TX (US); Lawrence P. Behn, Houston, TX (US); Klaus Domagalski, Katy, TX (US); Lianzhong Yu, Redmond, WA (US); Arjun Selvakumar, Bellaire, TX (US); Duli Yu, Sugar Land, TX (US); James L. Marsh, San Antonio, TX (US); Peter Maxwell, Missouri City, TX (US); David Morgan, Parker, TX (US); Thomas Buie, Richardson, TX (US); Kees Faber, Voorhour (NL); Sjoerd Altman, Zoetermeer (NL); Richard Laroo, Lisse (NL)

(73) Assignee: Input/Output, Inc., Stafford, TX (US)

( * ) Notice: Subject to any disclaimer, the term of this patent is extended or adjusted under 35 U.S.C. 154(b) by 0 days.

(21) Appl. No.: 09/936,634

(22) PCT Filed: Mar. 17, 2000
(Under 37 CFR 1.47)

(86) PCT No.: PCT/US00/07310

§ 371 (c)(1),
(2), (4) Date: Jun. 4, 2002

(87) PCT Pub. No.: WO00/55577

PCT Pub. Date: Sep. 21, 2000

(51) Int. Cl.
*G01D 11/10* (2006.01)
*G01P 15/00* (2006.01)
(52) U.S. Cl. ..................... 73/514.16; 73/431
(58) Field of Classification Search .............. 73/649, 73/570, 488, 493, 514.17; 702/127, 141, 702/150–154
See application file for complete search history.

(56) References Cited

U.S. PATENT DOCUMENTS 3,863,192 A   1/1975  Grey
4,019,094 A   4/1977  Dinger et al. .............. 361/220

(Continued)

FOREIGN PATENT DOCUMENTS

EP          0660119 A1    6/1995

(Continued)

*Primary Examiner*—Hezron Williams
*Assistant Examiner*—Tamiko Bellamy
(74) *Attorney, Agent, or Firm*—Madan, Mossman & Sriram, P.C.

(57) ABSTRACT

A sensor apparatus (104) includes a plural different spatial direction axis of sensitivity positioned sensor package containing sensor module (305) supported by a planar surface (345) within a cavity (340) of a housing (205) coupled to a first end cap (210) by a PC-board connection (355). Housing (205) is further coupled to first end cap (210) by a first coupling member (315) and a second coupling member (320) and is also coupled to an opposite second end cap (215) by a third coupling member (320) and a fourth coupling member (325). Interface sealing members (330a, 330b, 330c, 330d) seal between housing (205) and first end cap (210). Interface sealing members (335a, 335b, 335c, 335d) seal between housing (205) and second end cap (215).

32 Claims, 34 Drawing Sheets

U.S. PATENT DOCUMENTS

| | | | |
|---|---|---|---|
| 4,437,243 A | | 3/1984 | Brown |
| 4,534,007 A | * | 8/1985 | Rhyner .................... 702/150 |
| 4,745,564 A | * | 5/1988 | Tennes et al. ............. 702/141 |
| 5,012,316 A | * | 4/1991 | Silvermint ................. 257/417 |
| 5,101,669 A | | 4/1992 | Holm-Kennedy et al. ......... 73/862.64 |
| 5,294,829 A | | 3/1994 | Hundt |
| 5,343,748 A | | 9/1994 | Mozgowiec et al. .......... 73/497 |
| 5,490,323 A | | 2/1996 | Thacker et al. |
| 5,579,245 A | * | 11/1996 | Kato ......................... 702/150 |
| 5,783,748 A | | 7/1998 | Otani |
| 5,784,260 A | | 7/1998 | Fuller, Jr. et al. |
| 5,898,218 A | * | 4/1999 | Hirose et al. ................ 257/710 |
| 6,305,223 B1 | * | 10/2001 | Matsumoto et al. ...... 73/514.32 |

FOREIGN PATENT DOCUMENTS

| | | |
|---|---|---|
| JP | 05072227 A * | 3/1993 |
| JP | 07306047 A * | 11/1995 |
| WO | WO 99/16129 | 4/1999 |

* cited by examiner

INTEGRATED AND MULTI-AXIS SENSOR ASSEMBLY AND PACKAGING

BACKGROUND OF THE INVENTION

The present disclosure relates generally to the packaging of a sensor assembly, and in particular to packaging a multi-axis sensor assembly.

In packaging a multi-axis sensor assembly, high vector fidelity and low cross-axis sensitivity between the three major axes (x-axis, y-axis, and z-axis) is generally required. Orthogonally mounting three single-axis sensors typically results in low vector fidelity and high cross-axis sensitivity. There are also numerous manufacturing steps.

The present invention is directed at creating a multi-axis sensor package that has high vector fidelity, low cross-axis sensitivity, and a minimum number of manufacturing steps.

SUMMARY OF THE INVENTION

According to one aspect of the invention, an apparatus is provided that includes a housing, a plurality of end caps, a sensor module, a plurality of sealing members, and a plurality of coupling members.

According to another aspect of the invention, an apparatus is provided that includes a housing, a sensor, a lid assembly, and a controller assembly.

According to another aspect of the invention, an apparatus is provided that includes a plurality of sensor packages, each sensor package having an axis of sensitivity positioned in a different spatial direction.

According to another aspect of the invention, a method of coupling a controller to a housing is provided that includes dispensing an adhesive on the housing, placing the controller on the housing, curing the adhesive, wire-bonding the controller to the housing, encapsulating the controller and wire-bonds, and curing the encapsulant.

According to another aspect of the invention, a method of assembling a sensor package including of a housing, a sensor, a controller, and a lid assembly is provided that includes coupling the sensor to the housing, coupling the lid assembly to the housing, and coupling the controller to the housing.

According to another aspect of the invention, a method of assembling a multi-axis sensor assembly is provided that includes a plurality of sensor packages, each sensor package having an axis of sensitivity positioned in a different spatial direction.

According to another aspect of the invention, a sensor package is provided that includes a substrate including a slot and a sensor positioned within the slot.

According to another aspect of the invention, a method of assembling a sensor package is provided that includes a substrate and a sensor, including coupling the sensor to the substrate.

DETAILED DESCRIPTION OF THE ILLUSTRATIVE EMBODIMENTS

Figure 1:
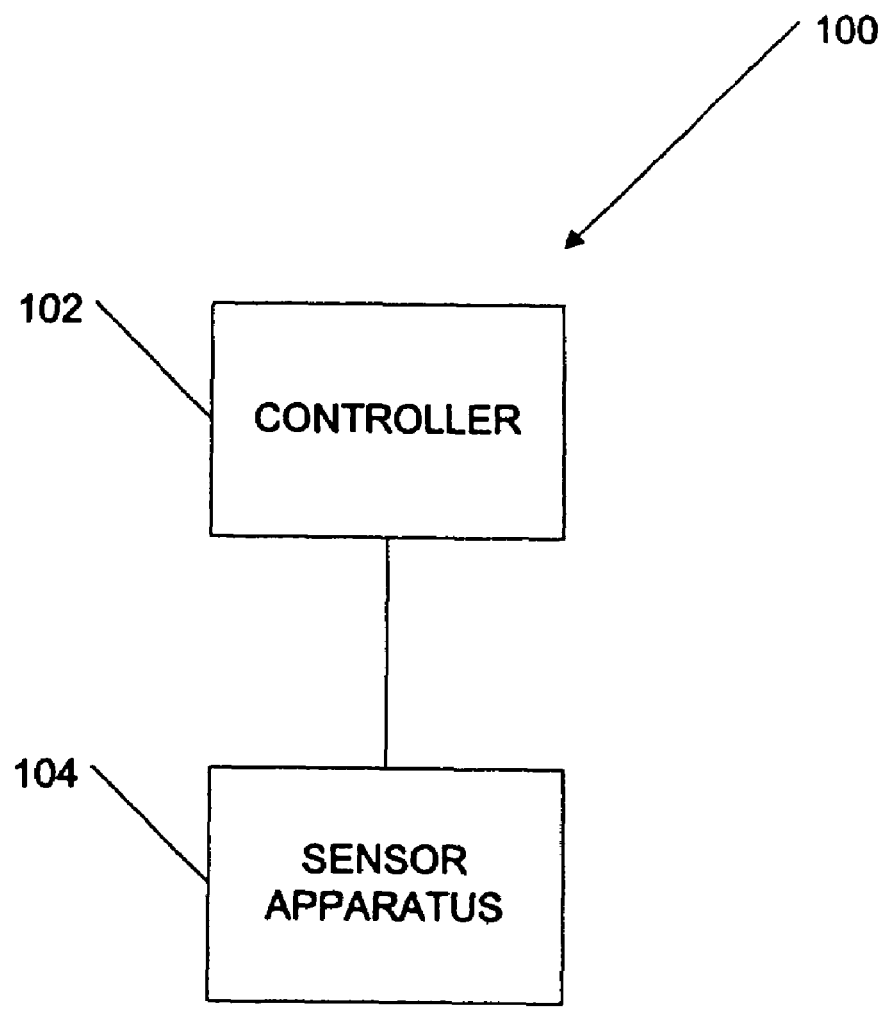
FIG. 1 is a schematic view illustrating an embodiment of a system for sensor measurement.

Referring initially to FIG. 1, an embodiment of a system 100 for recording seismic information preferably includes a controller 102 and a sensor apparatus 104.

The controller 102 monitors and controls the system 100. The controller 102 preferably receives data from the sensor apparatus 104. The controller 102 preferably monitors the sensor apparatus 104. The controller 102 is coupled to the sensor apparatus 104 by electrical connections. The controller 102 may be any number of conventional commercially available controllers, for example, of the type integrated circuit chips. In a preferred embodiment, the controller 102 is an application specific integrated chip for readout and control of the sensor.

In one embodiment, the sensor apparatus 104 ranges from about 0.75 inches to 1 inch in diameter for reduced cross-sectional area. In one embodiment, the sensor apparatus 104 is waterproof and pressure-proof for environmental protection.

Figure 2:
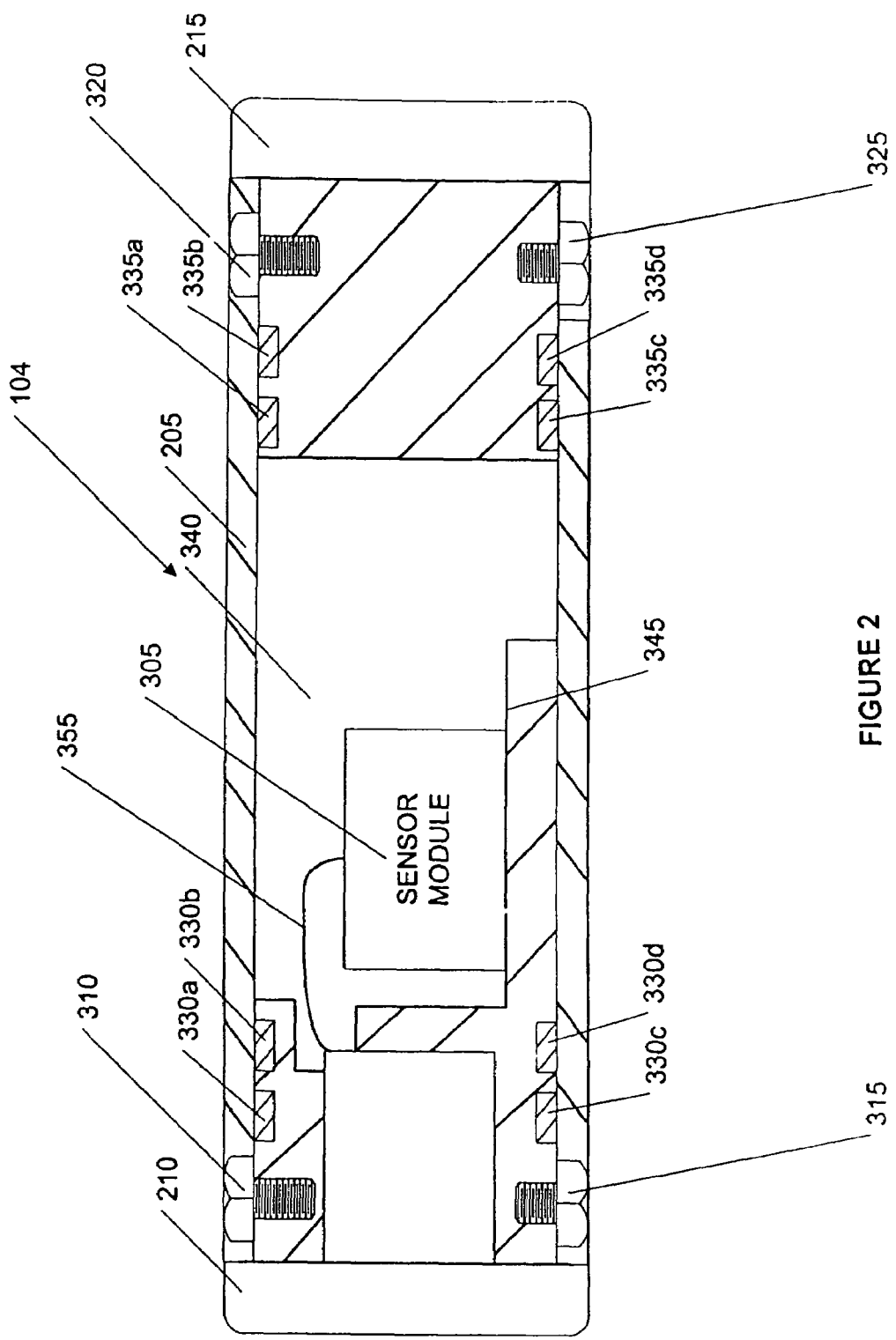
FIG. 2 is a cross-sectional view of an embodiment of the sensor apparatus of FIG. 1.

Referring to FIG. 2, an embodiment of the sensor apparatus 104 includes A a housing 205 coupled to a first end cap 210, a second end cap 215 and a sensor module 305. The housing 205 is coupled to the end caps 210 and 215 by coupling members such as mechanical fasteners 310, 315, 320 and 325. The mechanical fasteners are preferably capable of being torqued to a predetermined position in for mechanical coupling.

Sealing members 330a–d seal the interface between the housing 205 and the first end cap 210, and sealing members 335a–d seal the interface between the housing 205 and the second end cap 215. The sealing members 330a–d and 335a–d may be elastomer rings capable of being compressed to a predetermined position for sealing. The number of sealing members used is based on the sealing requirements of the interface between the housing 205 and the respective end cap 210 and 215.

The housing 205 preferably includes a cavity 340 and a planar surface 345. The housing 205 may be metal tubing. In one embodiment, the housing 205 is a metal tube fabricated from high strength materials in order to provide a robust pressure vessel.

The sensor module 305 is supported by the planar surface 345 within the cavity 340 of the housing 205 and is coupled to the first end cap 210 by a PC-board connection 355.

In several alternate embodiments, the sensor module 305 may be used in a variety of sensor apparatuses 104, for example, geophone packages, inclinometers, inertial guidance systems, and vibration monitor.

Figure 3:
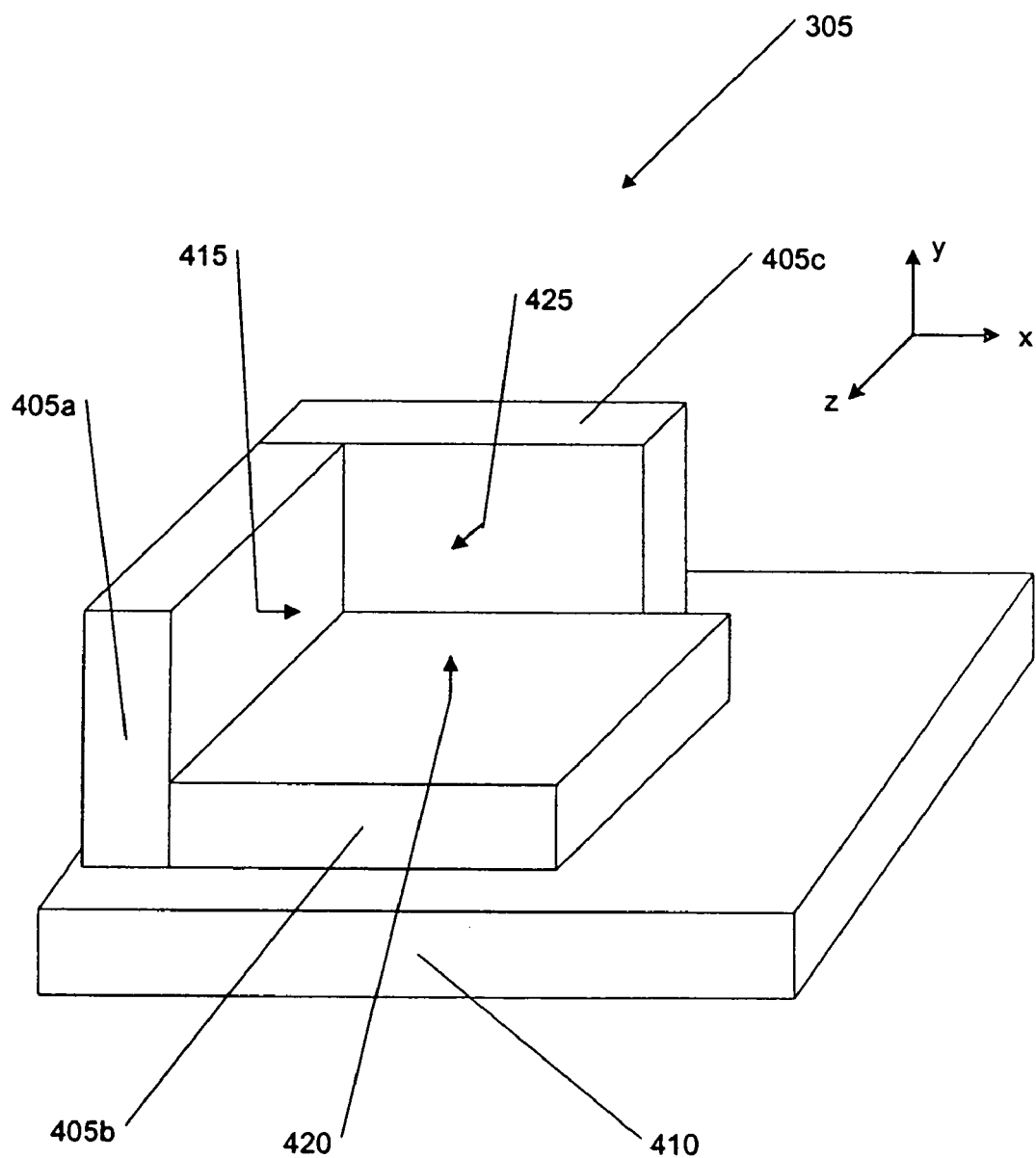
FIG. 3 is a schematic view of an embodiment of the sensor module of FIG. 2.

Referring to FIG. 3, the sensor module 305 preferably includes sensor packages 405a–c and a substrate 410. Each sensor package 405a–c includes a corresponding axis of sensitivity 415, 420 and 425. Each axis of sensitivity 415, 420 and 425 is approximately parallel to the x-axis, y-axis and z-axis, respectively.

The sensor packages 405a–c may be coupled to the substrate 410 using one of the following methods: solder-paste surface mount, solder-ball, or leads. The sensor packages 405a–c are preferably coupled to the substrate 410 by solder paste surface mount to provide low profile components. The substrate 410 is preferably a ceramic PC-board having high temperature capability. The substrate 410 may alternatively be an organic PC-board.

Figure 4A:
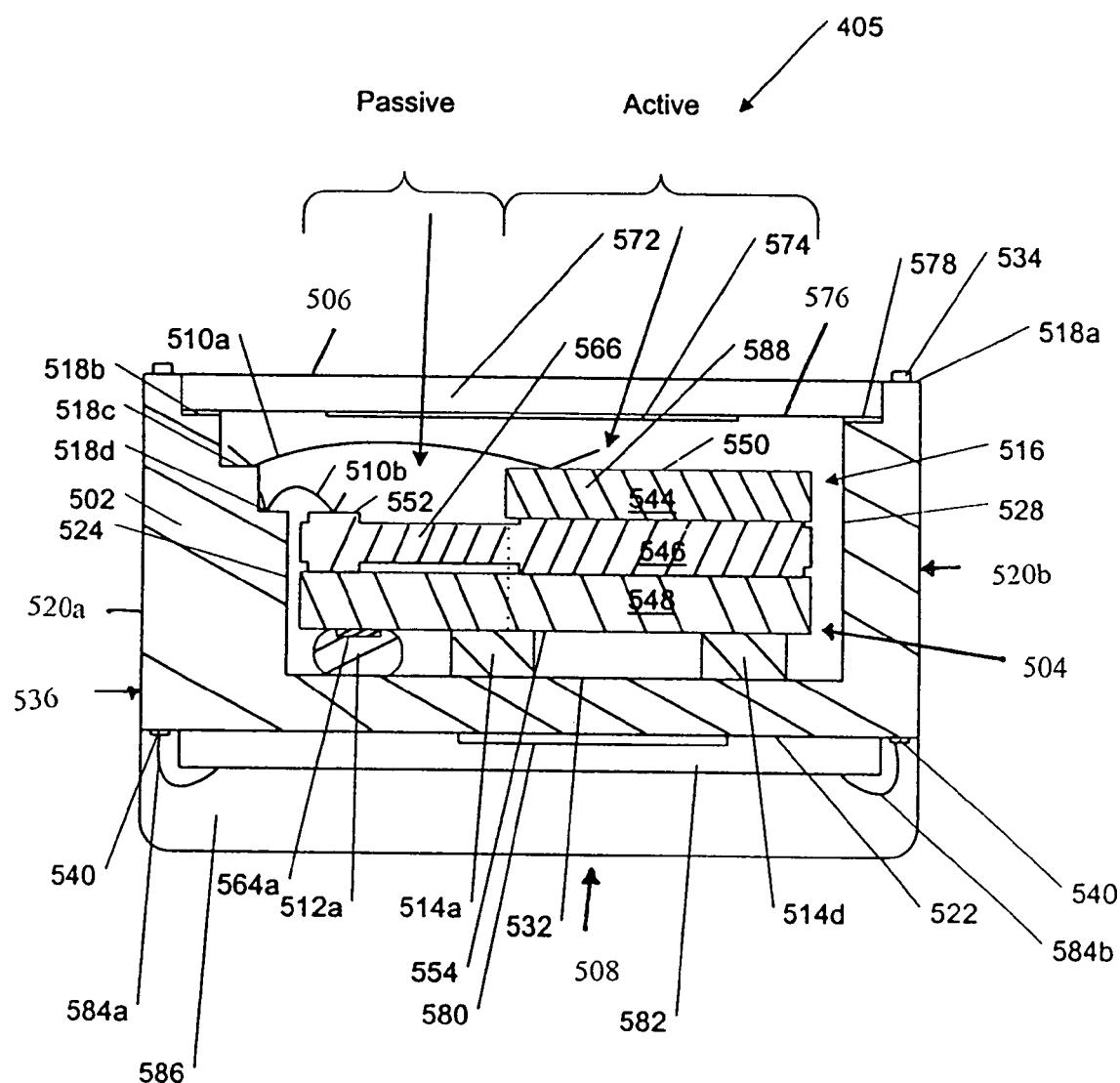
FIG. 4A is a cross-sectional view of an embodiment of the sensor package of FIG. 3.
Figure 4B:
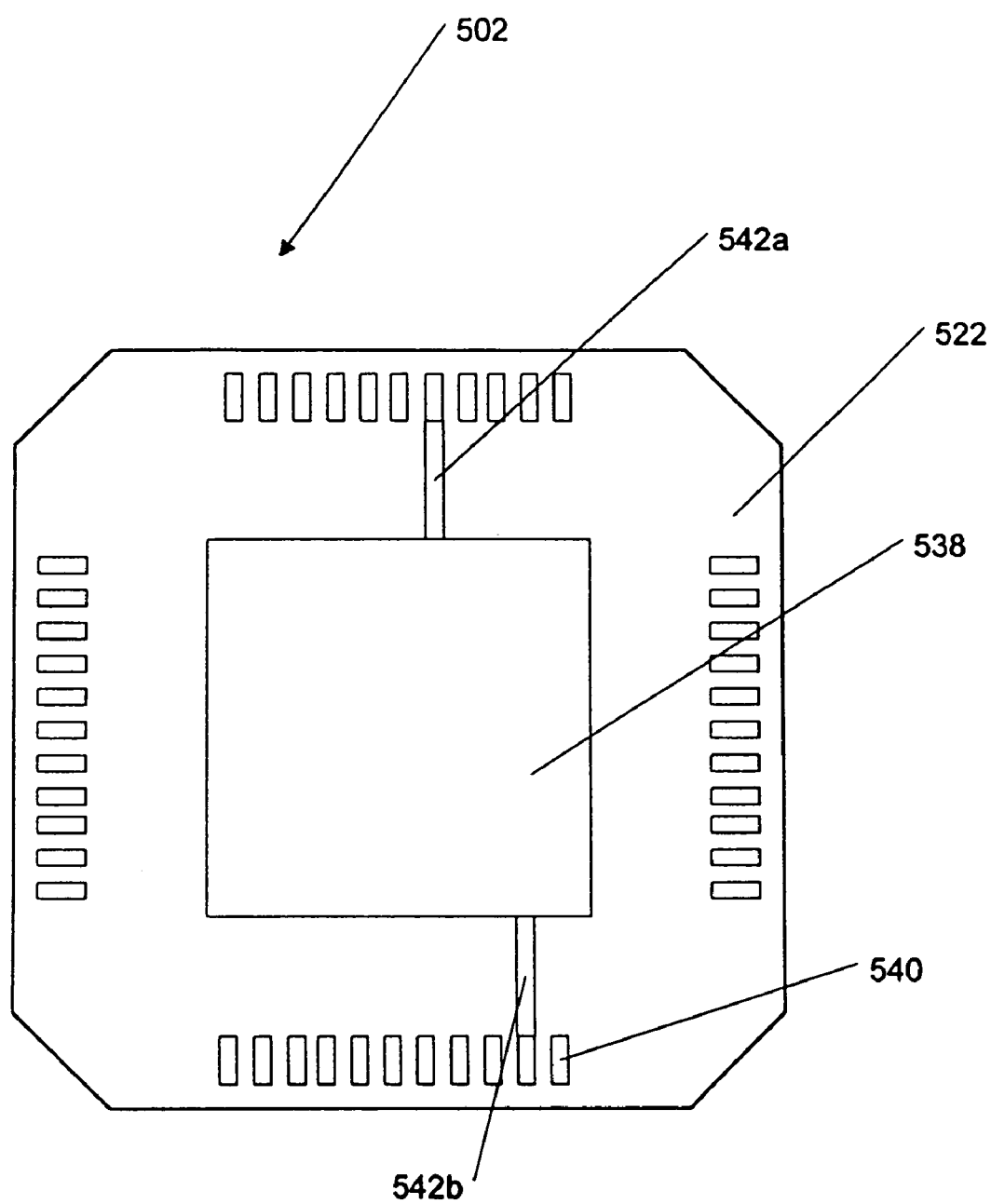
FIG. 4B is a bottom view of an embodiment of the housing of the sensor package of FIG. 4A.

Referring to FIGS. 4A and 4B, an embodiment of the sensor package 405 preferably includes a housing 502, a sensor 504, a lid assembly 506, and a controller assembly 508. The lid assembly 506 is preferably coupled to the top of the housing 502. The controller assembly 508 is preferably coupled to the bottom of the housing 502. The sensor 504 is preferably coupled within the housing 502.

The housing 502 is preferably coupled to the sensor 504, the lid assembly 506, the controller assembly 508, one or more electrical connections 510, one or more resilient couplings 512, and one or more sliding supports 514. The housing 502 preferably includes a cavity 516, one or more planar surfaces 518, one or more exterior surfaces 520, and a bottom exterior surface 522. The cavity 516 preferably includes a first wall 524, a second wall (not shown), a third wall 528 and a fourth wall (not shown). The first wall 524 and the third wall 528 are preferably approximately parallel to each other and the second wall and the fourth wall are preferably approximately parallel to each other. The second wall and the fourth wall are also preferably perpendicular to the first wall 524 and the third wall 528. The cavity 516 preferably includes a bottom surface 532. The bottom surface 532 may be ceramic. In one embodiment, the bottom surface 532 is gold plated to enable soldering. The housing 502 may be a conventional ceramic, plastic, or metal housing. A ceramic housing is preferable for vacuum sealing capability.

The housing 502 includes a first planar surface 518a, a second planar surface 518b, a third planar surface 518c, and a fourth planar surface 518d. The first planar surface 518a preferably includes one or more planar bond pads 534. The planar bond pads 534 are approximately rectangularly shaped. The planar bond pads 534 may be used for solder paste, solder balls or leads attachment. In one embodiment, the planar bond pads 534 are used to solder the sensor packages 405 to the substrate 410. The number of planar bond pads 534 depends on having sufficient planar bond pads 534 to connect the controller assembly 508 to the housing 502. The second planar surface 518b may be plated with a metal such as gold to enhance soldering. The third and fourth planar surfaces 518c–d may be plated with gold for wire bonding.

The housing 502 includes a plurality of first exterior surfaces 520a and a plurality of second exterior surfaces 520b. In one embodiment, there are four first exterior surfaces 520a and four second exterior surfaces 520b forming an approximate octagon. The second exterior surfaces 520b preferably couple the first exterior surfaces 520a to each other. The first exterior surfaces 520a preferably include one or more exterior bond pads 536. The exterior bond pads 536 are preferably approximately rectangularly shaped. The exterior bond pads 536 may be used for solder paste, solder ball or leads attachment. In one embodiment, the exterior bond pads 536 are used to solder the sensor package 405 to the substrate 410. In an alternate embodiment, the exterior bond pads 536 are on a single first exterior surface 520a The bottom exterior surface 522 of the housing 502 preferably includes a contact pad 538, one or more bond pads 540, and one or more connecting pads 542. The contact pad 538 may be gold-plated to provide a reliable electrical connection. The planar bond pads 534 on the first planar surface 518a are preferably electrically coupled to the bond pads 540 on the bottom exterior surface 522 by electrical paths molded into the housing 502. The resilient couplings 512, the third planar surface 518c and the fourth planar surface 518d are preferably coupled to the bond pads 540 on the bottom exterior surface 522 by electrical paths molded into the housing 502. The bond pads 540 may be gold-plated for wire bonding. The number of bond pads 540 depends on having sufficient bond pads 540 to connect the controller assembly 508 to the housing 502. The connecting pads 542 preferably connect the contact pad 538 to the bond pads 540. The connecting pads 542 are preferably gold-plated to provide a conductive pathway between the contact pad 538 and the bond pads 540. In one embodiment, there is a first connecting pad 542a and a second connecting pad 542b. The exterior bond pads 536 may be electrically connected to the bond pads 540 by electrical paths molded into the housing 502.

The sensor 504 is preferably resiliently attached to the housing 502 by the resilient couplings 512, slidingly supported by the sliding supports 514, and electrically coupled to the housing 502 by the electrical connections 510. The sensor 504 may have an approximately rectangular cross-sectional shape. The sensor 504 preferably has a passive region 566 at one end and an active region 588 at an opposite end. In one embodiment, the sensor 504 includes a first member 544, a second member 546, and a third member 548. The first member 544 is preferably on top of the second member 546 and the second member 546 is preferably on top of the third member 548. In one embodiment, the first member 544, the second member 546, and the third member 548 are a micro machined sensor substantially as disclosed in copending PCT Patent Application Ser. No. US00/40039, filed on Mar. 16, 2000, the contents of which are incorporated herein by reference.

The first member 544 includes one or more parallel planar surfaces such as a top parallel planar surface 550. The second member 546 includes one or more parallel planar surfaces such as a middle parallel planar surface 552. The third member 548 includes one or more parallel planar surfaces such as a bottom parallel planar surface 554.

The bottom parallel planar surface 554 of the sensor 504 includes a first side, a second side, a third side, and a fourth side 562 not separately numbered. The first through fourth sides provide the bottom parallel planar surface 554 a substantially rectangular or square cross-sectional shape.

In one embodiment, the bottom parallel planar surface 554 of the sensor 504 includes one or more bond pads 564 located in the passive region 566 of the bottom parallel planar surface 554 of the sensor 504. The bond pads 564 may be located a perpendicular distance ranging from about 5 to 25 mils from the first side of the bottom parallel planar surface 554 and may be located a perpendicular distance ranging, for example, from about 5 to 25 mils from the second side of the bottom parallel planar surface 554. In one embodiment, the bond pads 564 are located a perpendicular distance ranging from about 7 to 12 mils from the first and second sides of the bottom parallel planar surface 554 to reduce effects of thermal stress.

The bond pads 564 may be used for solder, conductive epoxy, non-conductive epoxy or glass frit bonding. In one embodiment, the bond pads 564 are used for solder bonding to provide ease of manufacture. In one embodiment, the bond pads 564 contact area selected to provide shock tolerance for the sensor 504. The bond pads 564 should have minimal discontinuities to facilitate distribution of thermal stresses in the sensor 504. In several alternate embodiments, there are a plurality of bond pads 564 to relieve thermal stresses in the sensor 504. There may be a single bond pad 564a having an approximately rectangular cross-sectional shape. The length and width of the bond pad 564a may range from about 200 to 240 mils and 15 to 25 mils, respectively. In one embodiment, the length and width of the bond pad 564a ranges from about 200 to 220 mils and 18 to 22 mils, respectively, to reduce effects of thermal stress. The height of the bond pad 564a may range from about 0.1 to 1 micron, and preferably ranges from about 0.24 to 0.72 microns to reduce effects of thermal stresses.

The resilient couplings 512 resiliently attach the bond pads 564 to the housing 502. The resilient couplings 512 may electrically attach the sensor 504 to the housing 502. The resilient couplings 512 may be coupled to the bottom surface 532 of the cavity 516 of the housing 502. In one embodiment, the resilient couplings 512 are solder preforms. The resilient couplings 512 should have minimal discontinuities to facilitate distribution of thermal stresses in the sensor 504. In several alternate embodiments, there are a plurality of resilient couplings 512 to relieve thermal stresses in the sensor 504. The resilient couplings 512 may have an approximate cross-sectional rectangular shape, and be any number of conventional commercially available solder preforms of the type eutectic or non-eutectic. Eutectic type preforms provide good yield strength with a reasonable melt temperature. In one embodiment, there is a single resilient coupling 512a.

The length and width of the resilient coupling 512a may range from about 200 to 250 mils and 20 to 35 mils, respectively. In one embodiment, the length and width of the resilient coupling 512a range from about 225 to 235 mils and 25 to 30 mils, respectively to reduce effects of thermal stresses. The height of the resilient coupling 512a may range from about 2 to 4 mils, and preferably ranges from about 2.5 to 3 mils.

The resilient couplings 512 may be located a perpendicular distance ranging from about 5 to 25 mils from the first and second walls 524 and 526 of the cavity 516 of the housing 502. In one embodiment, the resilient couplings 512 are located a perpendicular distance ranging from about 7 to 12 mils from the first and second walls 524 and 526 to relieve thermal stresses.

In another embodiment, the resilient couplings 512 further include one or more bumpers (not separately shown) for slidingly supporting the sensor 504. The bumpers are proximate to the bond pads 564. The width of each bumper may range from about 2 to 6 mils to reduce stresses. In one embodiment, the resilient couplings 512 are coupled to the bond pads 564 using conventional solder equipment and processes. The resilient couplings 512 may be coupled to the bottom surface 532 of the cavity 516 of the housing 502 using conventional solder equipment and processes.

The sliding supports 514 slidingly support the sensor 504 and are coupled to the bottom surface 532 of the cavity 516 of the housing 502. The sliding supports 514 may be tungsten or ceramic. In one embodiment, the sliding supports 514 have an approximately square cross sectional shape. The cross sectional area of the sliding supports 514 may range from about 400 to 1600 square mils, individually to reduce the effects of thermal stresses. The height of the sliding supports 514 may range from about 0.5 to 3 mils. The number of sliding supports 514 depends on having sufficient sliding supports 514 to slidingly support the sensor 504.

In another embodiment, there is a first sliding support 514a, a second sliding support (not shown), a third sliding support (not shown), and a fourth sliding support 514d. The first sliding support 514a is located adjacent to one side of the resilient couplings 512. The second sliding support is located adjacent to the first sliding support 514a. The third sliding support is located adjacent to one side of the resilient couplings 512 and approximately perpendicular to the first sliding support 514a. The fourth sliding support 514d is located adjacent to the third sliding support.

The first sliding support 514a may be located a perpendicular distance ranging from about 45 to 75 mils and about 85 to 115 mils from the first wall 524 and second wall of the cavity 516, respectively. In one embodiment, the first sliding support 514a is located a perpendicular distance ranging from about 52 to 62 mils and about 90 to 105 mils from the first wall 524 and second wall of the cavity 516, respectively to reduce thermal stresses.

The second sliding support may be located a perpendicular distance ranging from about 45 to 75 mils and about 15 to 30 mils from the first wall 524 and second wall of the cavity 516, respectively. In one embodiment, the second sliding support is located a perpendicular distance ranging from about 52 to 62 mils and about 20 to 25 mils from the first wall 524 and second wall of the cavity 516, respectively to reduce thermal stresses.

The third sliding support may be may be located a perpendicular distance ranging from about 85 to 115 mils and about 15 to 30 mils from the first wall 524 and second wall of the cavity 516, respectively. In one embodiment, the third sliding support is located a perpendicular distance ranging from about 90 to 105 mils and about 20 to 25 mils from the first wall 524 and second wall of the cavity 516, respectively, to reduce thermal stresses.

The fourth sliding support 514d may be located a perpendicular distance ranging, for example, from about 85 to 115 mils from the first wall 524 and second wall of the cavity 516 of the housing 502. In one embodiment, the fourth sliding support 514d is located a perpendicular distance ranging from about 90 to 105 mils from the first wall 524 and second wall of the cavity 516 to reduce thermal stresses. The sliding supports 514 are coupled to the bottom surface 532 of the cavity 516 of the housing 502 using conventional techniques for integrating the sliding supports 514 into the housing 502.

The electrical connections 510 electrically couple the sensor 504 to the housing 502. In one embodiment, the electrical connections 510 are wire bonds selected from conventional commercially available wire bonds of the type aluminum or gold. In one embodiment, there is a first electrical connection 510a and a second electrical connection 510b. The first electrical connection 510a electrically couples the third planar surface 518c of the housing 502 to the top parallel planar surface 550 of the sensor 504. The second electrical connection 510b electrically couples the fourth planar surface 518d of the housing 502 to the middle parallel planar surface 552 of the sensor 504. In one embodiment, the electrical connections 510 are coupled to the housing 502 using conventional wire bonding equipment and processes.

The lid assembly 506 is coupled to the housing 502. The lid assembly 506 includes a lid 572 and a getter 574. The lid 572 may be Kovar™ or ceramic. The lid 572 is preferably alloy 42 to facilitate vacuum sealing. The lid 572 may be plated with an assortment of metals such as an industry standard composite layer of gold/nickel/gold/nickel for soldering. In one embodiment, the length and width of the lid 572 is at least 0.010 inches less than the length and width of the second planar surface 518b for alignment tolerance. The height of the lid 572 may range from about 0.01 inches to 0.02 for planarity with the housing 502.

The getter 574 may be any commercially available getter having length and width about 0.125 inches less than the length and width of the lid 572 for good vacuum ambient and alignment tolerance. The height of the getter 574 may range from about 0.005 inches to 0.020 inches for good vacuum ambient and alignment tolerance.

The lid 572 includes a bottom surface 576, and the getter 574 is coupled to the bottom surface 576 using conventional welding equipment and processes. The bottom surface 576 of the lid 572 is coupled to the housing 502 via a solder preform 578 similar in material to the coupling 512 described above. The solder preform 578 is coupled to the second planar surface 518b of the housing 502 using conventional solder equipment and processes. The solder preform 578 may be an approximately rectangular ring that conforms to the shape of the second planar surface 518b. The outer length and exterior width of the solder preform 578 is at least 0.010 inches less than the outer length and exterior width of the second planar surface 518b for good alignment tolerance. The height of the solder preform 578 ranges from about 0.0025 inches to 0.0035 for a good vacuum seal. The interior length and interior width of the solder preform 578 is at least as long as the interior length and interior width of the second planar surface 518b for alignment tolerance and a good solder seal. The lid 572 is coupled to the solder preform 578 using conventional vacuum sealing equipment and processes. The housing 502, the sensor 504, and the lid 506 are vacuum-sealed to remove excess gas from the cavity 516.

The controller assembly 508 may include an adhesive 580, a controller 582, one or more wire bonds 584, and an encapsulant 586. The controller assembly 508 is coupled to the bottom exterior surface 522 of the housing 502. The adhesive 580 is coupled to the contact pad 538. The adhesive 580 may be solder, epoxies or silicone-based. In one embodiment, the adhesive 580 is silicone-based for stress relief.

The controller 582 is coupled to the adhesive 580. The controller 582 may be an integrated circuit chip such as an application specific integrated chip (ASIC) for closed-loop control of the sensor 504. The adhesive 580 is cured using conventional curing methods for the adhesive 580 used.

The wire bonds 584 are coupled to the controller 582 and the bond pads 540. The wire bonds 584 may be aluminum or gold. The wire bonds 584 couple the bond pads 540 to the controller 582. The wire bonds 584 are coupled to the bond pads 540 and controller 582 using conventional wire bonding equipment and processes.

The controller 582 and the wire bonds 584 may be encapsulated with the encapsulant 586 such as glob top polymer having a depth sufficient for a hermetic seal. The encapsulant 586 is cured using conventional curing methods for the encapsulant 586 used.

In an alternate embodiment, the housing 502 further includes circuit components that may be integrated into one or more of the housing 502 surfaces. In one embodiment, the circuit components are integrated into the bottom exterior surface 522 to reduce the size of the sensor module 405. The circuit components may be any electrical circuit components such as filtering capacitors, resistors, or active components.

Alternatively, one or more of the lid assembly 506, the controller assembly 508, the sliding supports 514, the getter 574, and the exterior bond pads 536 are optional In several alternative embodiments, the overall geometry and number of the bond pads 564 may be selected according to application preferences. For example, the bond pads may be two or three bond pads substantially equal in size, horizontally or vertically spaced proximate to each other, and have an approximately rectangular or oval cross-sectional shape. There may be a single bond pad having an approximately oval, tri-oval, oct-oval or wavy-sided cross-sectional shape. There may be two bond pads horizontally proximate to each other and have an approximately rectangular cross-sectional shape, where one bond pad is smaller in size than the other bond pad.

The resilient coupling 512 described above may alternatively be two resilient couplings substantially equal and are vertically proximate to each other. In several alternate embodiments, the sliding supports 514 include one or more sliding supports. The sliding supports may have an approximately rectangular, triangular or circular cross-sectional shape.

Figure 5A:
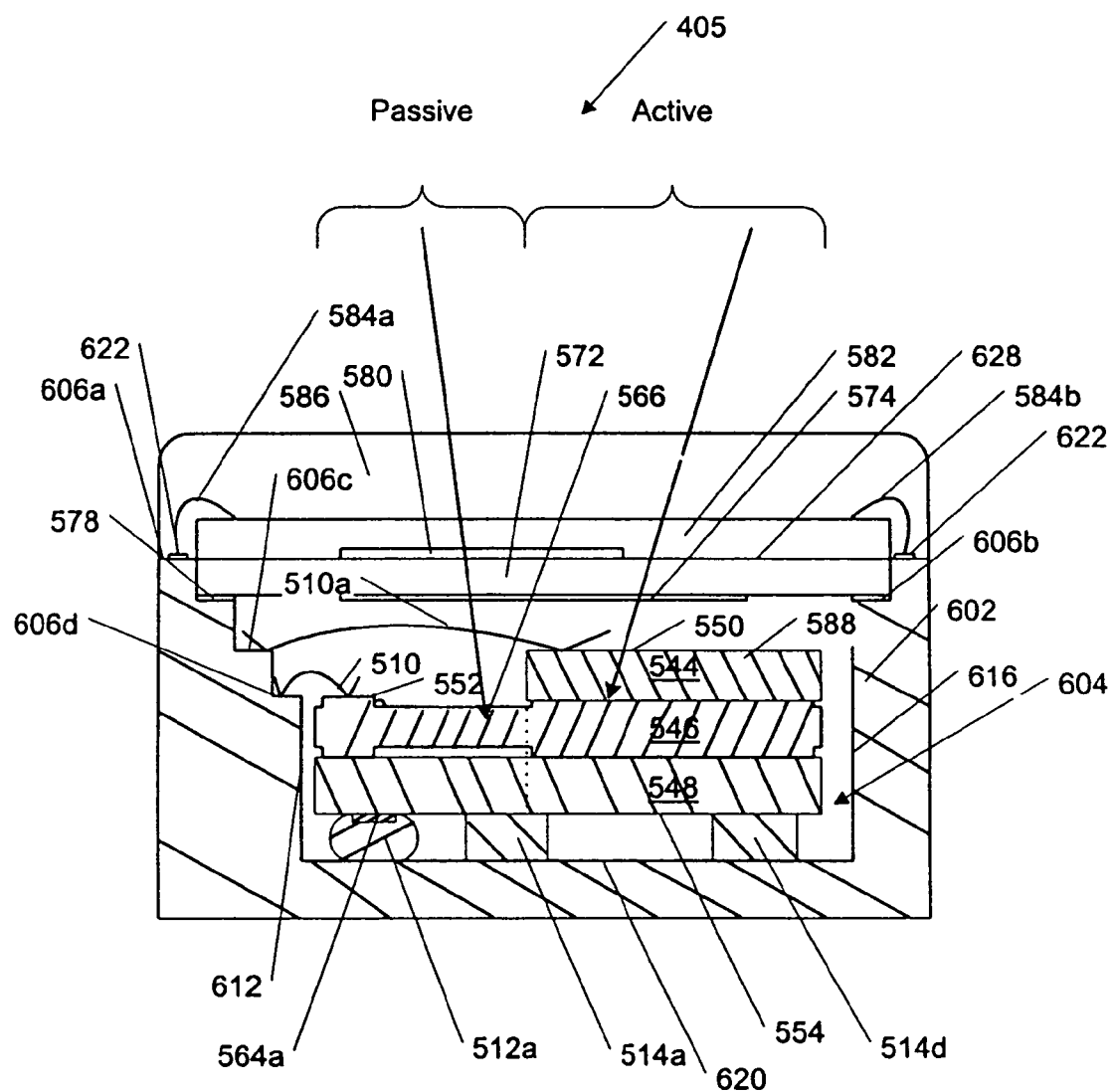
FIG. 5A is a cross-sectional view of an embodiment of the sensor package of FIG. 3.
Figure 5B:
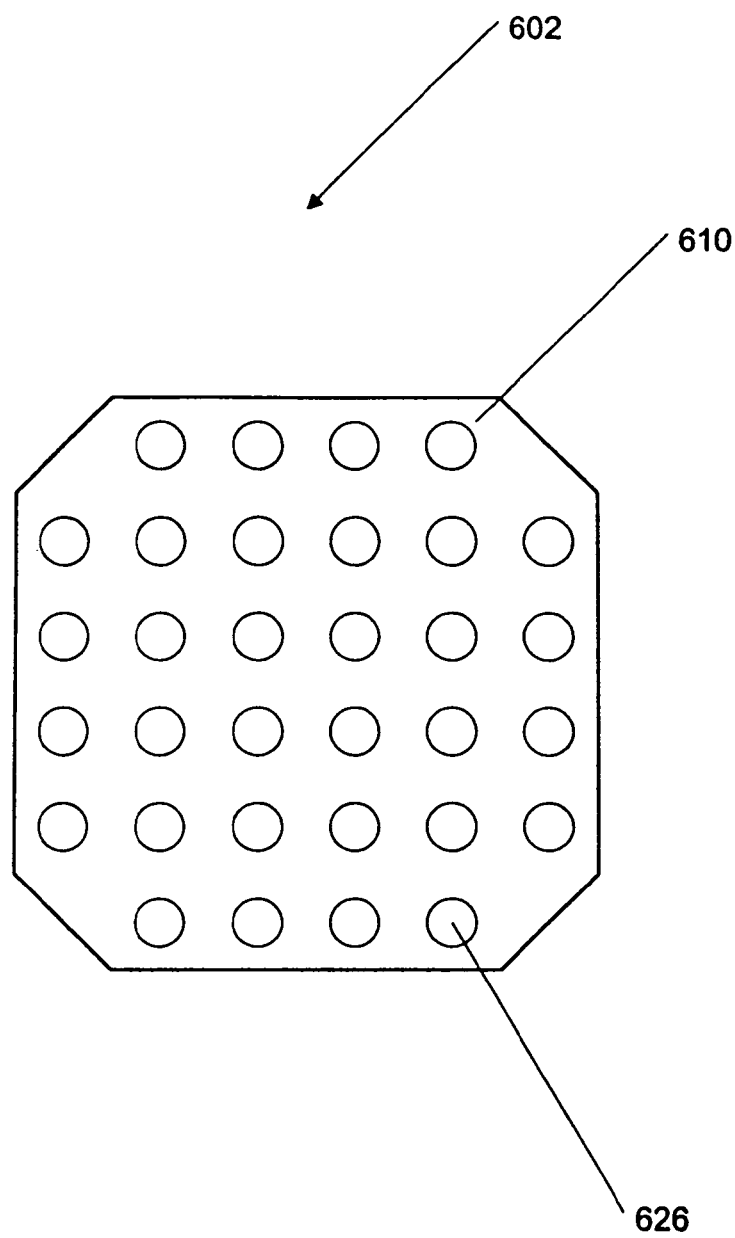
FIG. 5B is a bottom view of an embodiment of the housing of the sensor package of FIG. 5A.

Referring to FIGS. 5A and 5B, an alternate embodiment of the sensor package 405 is shown that is substantially similar to the embodiment shown in FIG. 4A except that in the embodiment of FIG. 5A the controller assembly 508 is coupled to the top of a housing 602.

The housing 602 is coupled to the sensor 504, the lid assembly 506, the controller assembly 508, the electrical connections 510, the resilient couplings 512, and the sliding supports 514. The housing 602 includes a cavity 604, one or more planar surfaces 606, one or more exterior surfaces such as bottom exterior surface 610. The cavity 604 includes a first wall 612, a second wall (not shown), a third wall 616, and a fourth wall (not shown). All walls 612, 616, pads 622, 626, surfaces 606a–d, 610, 620, 628, cavity 604, and housing 602 are all substantially as described above with respect to the embodiments shown in FIG. 4A with differences being only in the number and dimensions of the elements.

The bottom exterior surface 610 of the housing 602 differs from the bottom surface of the housing 502 described above and shown in FIG. 4B. The bottom exterior surface 610 includes one or more bond pads 626. The bond pads 626 may be approximately circular in shape and are used for solder paste, solder balls or leads attachments. In one embodiment, the bond pads 626 are gold plated for soldering. The number of bond pads 626 depends on having sufficient bond pads 626 to connect the sensor module 405 to the substrate 410. The planar bond pads 622 are electrically coupled to the bond pads 626 by electrical paths molded into the housing 602.

In several alternate embodiments, the bond pads 564, resilient couplings 512 and sliding supports 514 may be selected from the configurations described above with respect to the embodiment shown in FIG. 4A.

Figure 6A:
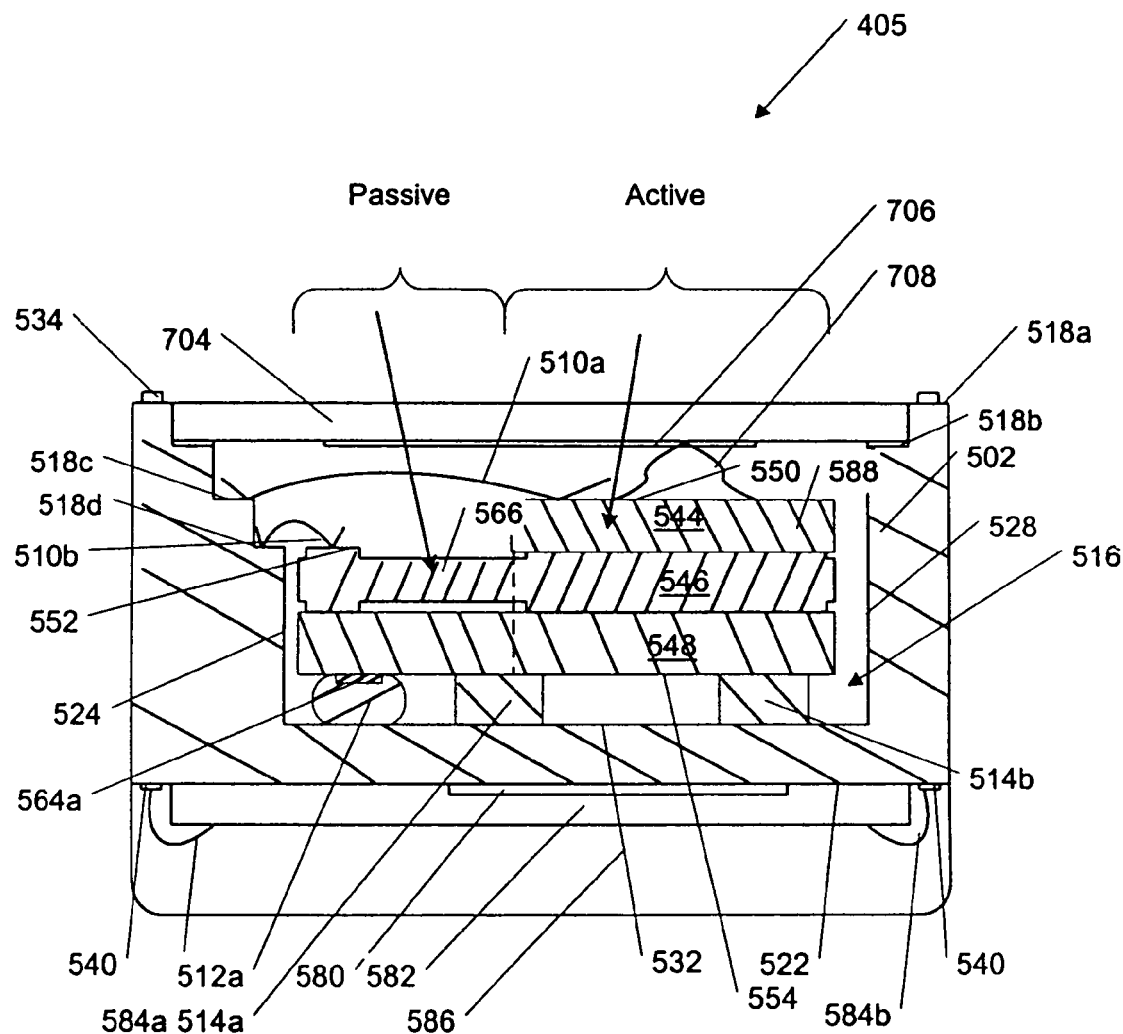
FIG. 6A is a cross-sectional view of an embodiment of the sensor package of FIG. 3.
Figure 6B:
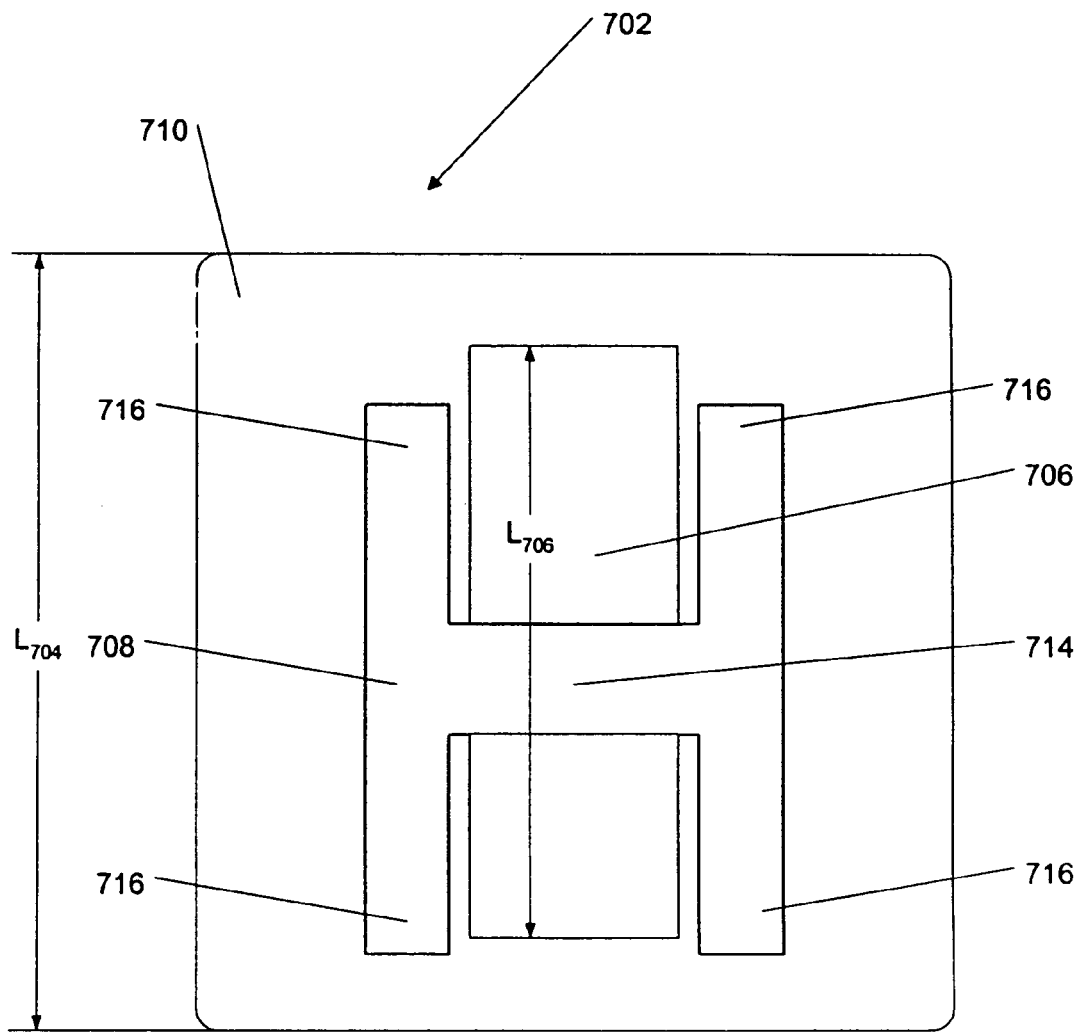
FIG. 6B is a bottom view of an embodiment of the lid assembly of the sensor package of FIG. 6A.

Referring to FIG. 6A an alternate embodiment of the sensor package 405 is shown that includes the housing 502, the sensor 504, a lid assembly 702, and the controller assembly 508. The lid assembly 702 is preferably coupled to the top of the housing 502. The controller assembly 508 is preferably coupled to the bottom of the housing 502. The sensor 504 is preferably coupled within the housing 502. This embodiment is substantially similar to the embodiment described above and shown in FIG. 4A, except for an added spring in the lid assembly 702.

The lid assembly 702 is preferably coupled to the housing 502. The lid assembly 702 preferably includes a lid 704, a getter 706 and a spring 708. The lid 704 further preferably includes a bottom surface 710 and a top surface 712.

The spring 708 may be fabricated from 0.003" stainless steel or beryllium copper strips. In one embodiment the spring 708 is stainless steel for its mechanical strength and stable properties. The spring 708 may be H-shaped defining a center bar and four arms. The spring 708 is welded to the bottom surface 710 of the lid 704. The four arms of the spring 708 preferably curl downwardly away from the bottom surface 710 of the lid 704. The four arms couple the bottom surface 710 of the lid 704 to the top parallel planar surface 550 of the sensor 504. The spring 708 secures the sensor 504 to the resilient couplings 512. The spring 708 electrically couples the sensor 504 to the housing 502.

Figure 7:
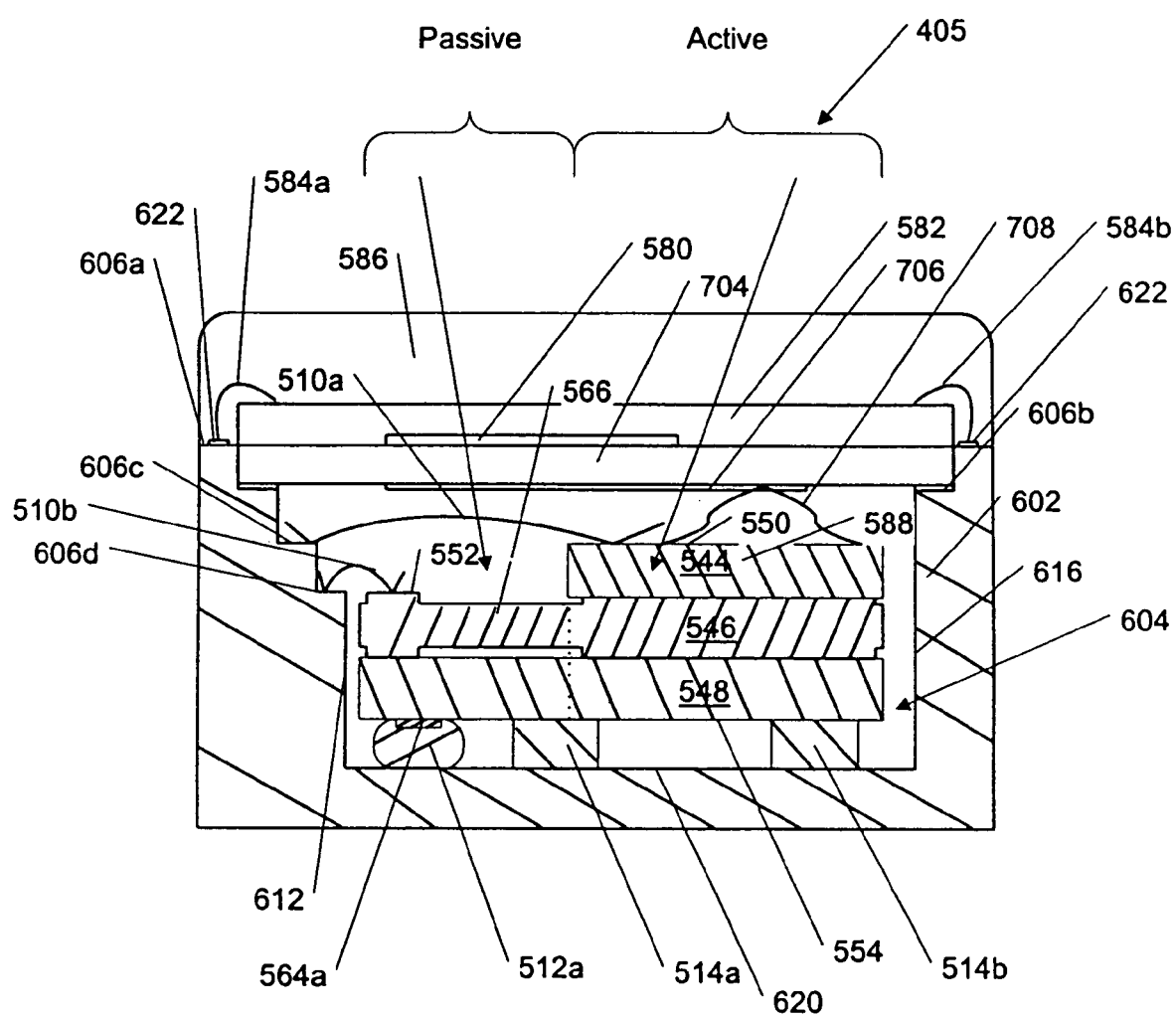
FIG. 7 is a cross-sectional view of an embodiment of the sensor package of FIG. 3.

Referring to FIG. 7, an alternate embodiment of the sensor package 405 preferably includes the housing 602, the sensor 504, the lid assembly 702, and the controller assembly 508. The lid assembly 702 is preferably coupled to the top of the housing 602. The controller assembly 508 is preferably coupled to the top of the housing 602. The sensor 504 is preferably coupled within the housing 602. This embodiment combines the features of the previously shown and described embodiments in that the lid assembly of FIG. 6A including spring 708 is added to the top-mounted controller assembly of FIG. 5A. As such, all component variations applicable to the previously-described embodiments are considered equally applicable and described by reference for alternative embodiments based on the structure of FIG. 7.

Figure 8:
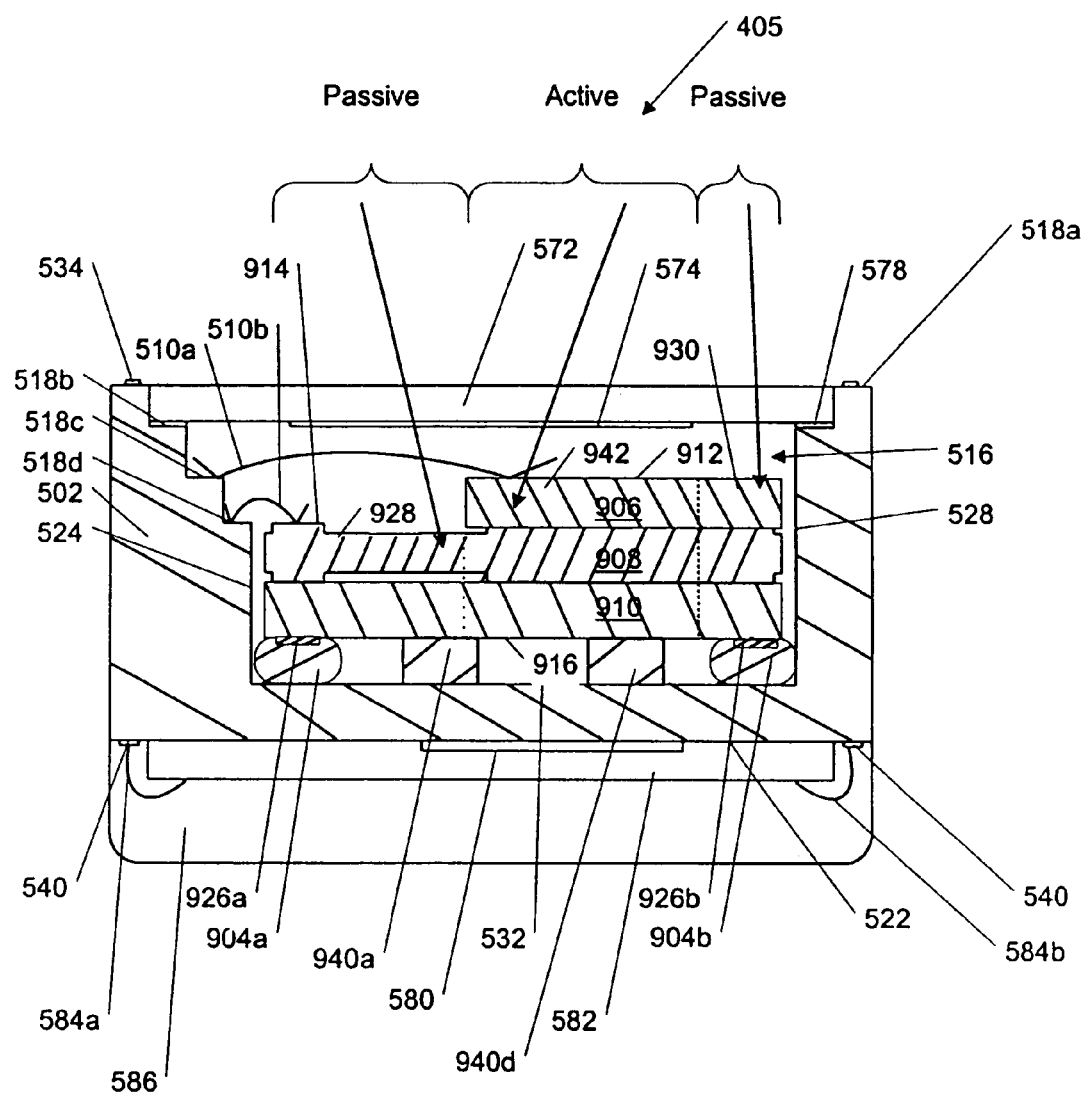
FIG. 8 is a cross-sectional view of an embodiment of the sensor package of FIG. 3.

Referring to FIG. 8, an alternate embodiment of the sensor package 405 preferably includes the housing 502, a sensor 902, the lid assembly 506, and the controller assembly 508. The lid assembly 506 is preferably coupled to the top of the housing 502. The controller assembly 508 is preferably coupled to the bottom of the housing 502. The sensor 902 is preferably coupled within the housing 502. This embodiment includes a passive/active/passive configuration of the sensor 902 created by the use of resilient couplings 904, and sliding supports 940.

The sensor 902, resilient couplings 904, sliding supports 940, first passive region 928, second passive region 930, active region 942 located between the first and second passive regions 928 and 930 are all substantially as described above with respect to FIG. 4A with the exception of dual passive regions 928 and 930.

First member 906, second member 908, and third member 910 of sensor 902 are likewise similar to members 544, 546, and 548 described above and shown in FIG. 4A.

Surface 912, middle parallel planar surface 914, and bottom parallel planar surface 916 and corresponding sides 918, 920 and 922 are similar is all respects to similar surfaces and sides described above and shown in FIG. 4A.

Bottom parallel planar surface 916 of the sensor 902 includes one or more bond pads 926 and one or more bumpers similar in all respects to the bond pads and bumpers described above and shown in FIG. 4A.

Figure 9:
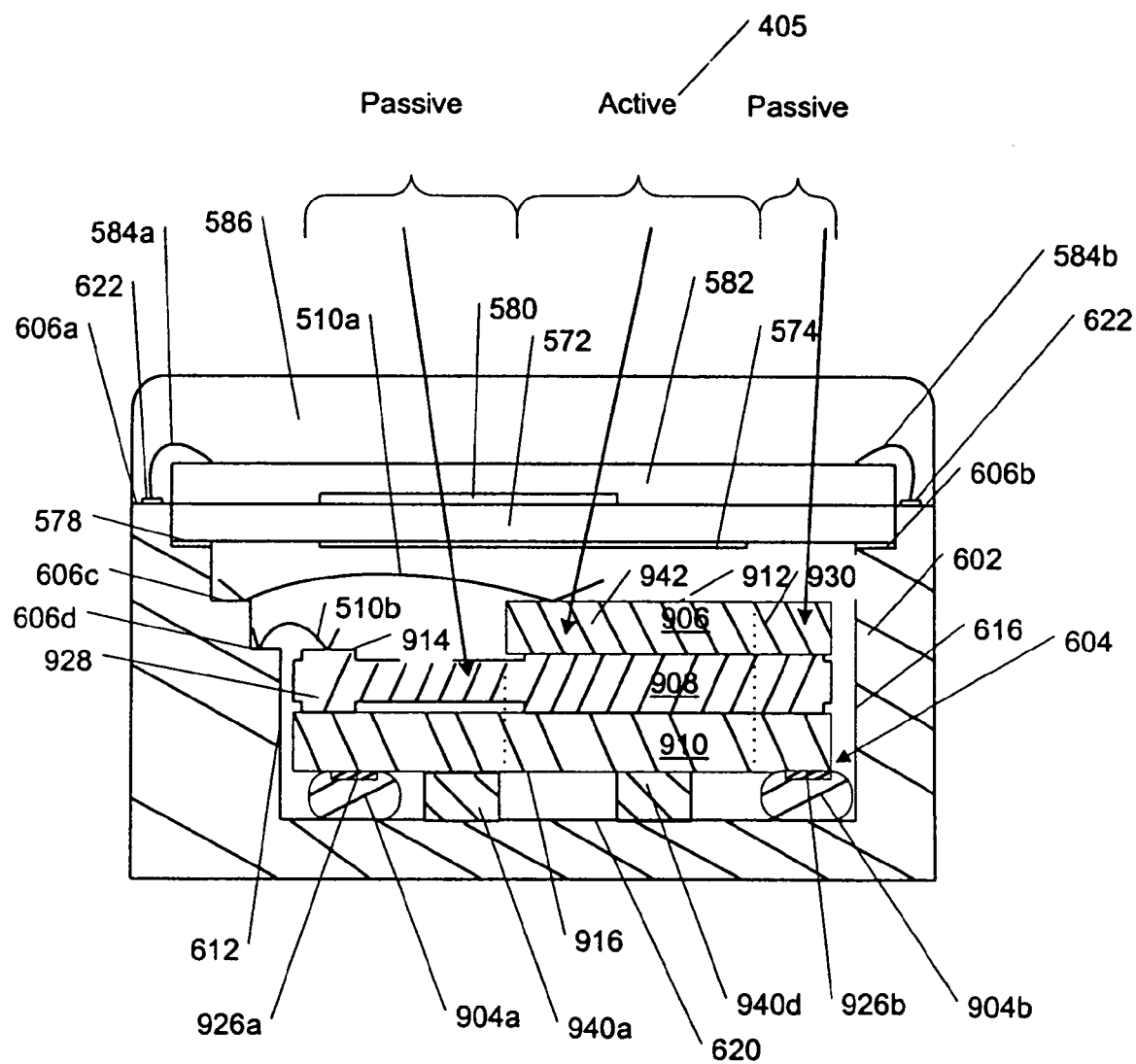
FIG. 9 is a cross-sectional view of an embodiment of the sensor package of FIG. 3.

Referring to FIG. 9, an alternate embodiment of the sensor package 405 includes the housing 602, the sensor 902, the lid assembly 506, and the controller assembly 508. The lid assembly 506 is coupled to the top of the housing 602. The controller assembly 508 is coupled to the top of the housing 602. The sensor 902 is coupled within the housing 602. This embodiment is the passive/active/passive sensor embodiment of FIG. 8 with a top-mounted controller assembly 508.

Figure 10:
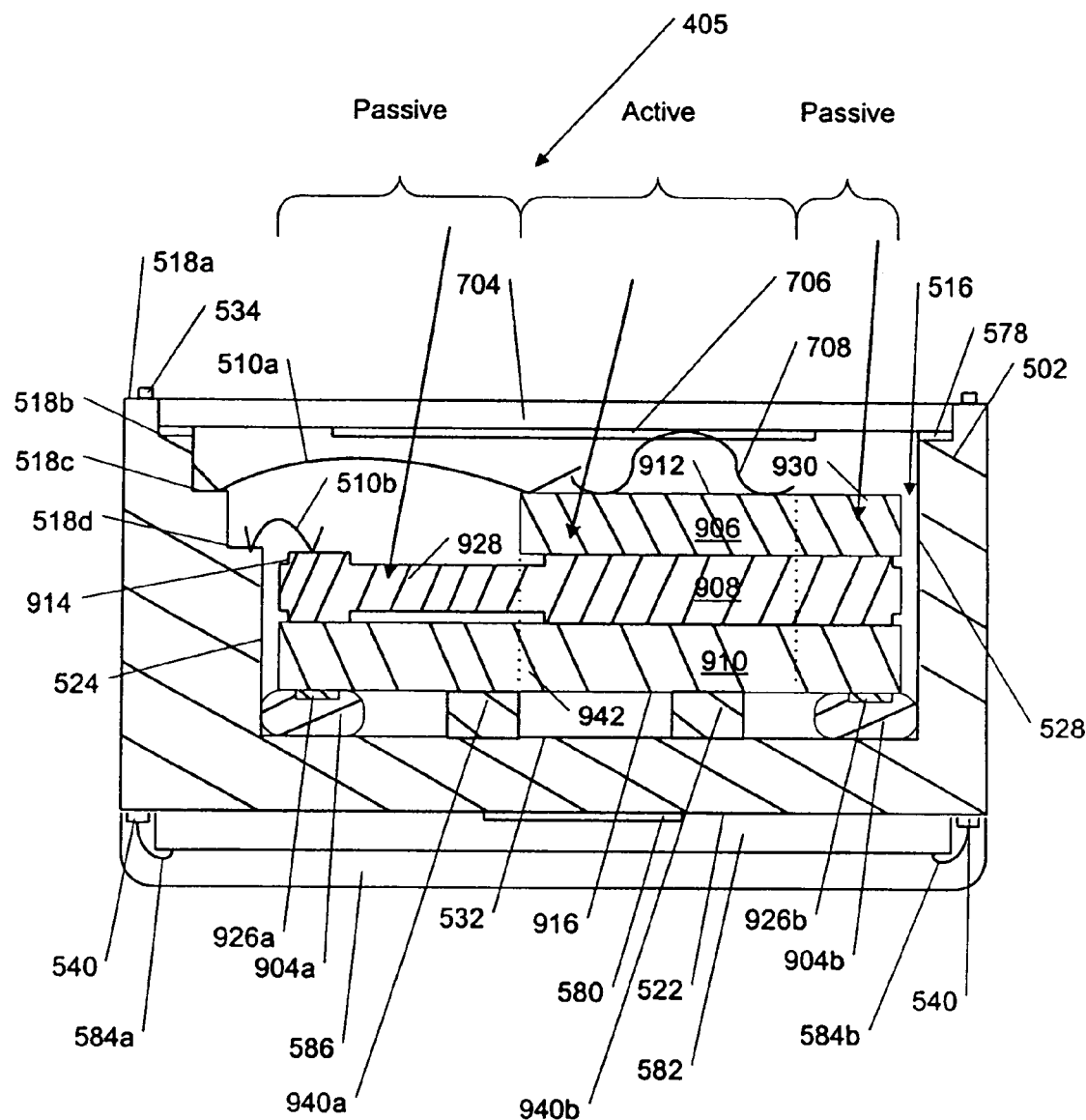
FIG. 10 is a cross-sectional view of an embodiment of the sensor package of FIG. 3.

Referring to FIG. 10, an alternate embodiment of the sensor package 405 includes the housing 502, the sensor 902, the lid assembly 702, and the controller assembly 508. The lid assembly 702 is coupled to the top of the housing 502. The controller assembly 508 is coupled to the bottom of the housing 502. The sensor 902 is preferably coupled within the housing 502. This embodiment is the passive/ active/passive sensor embodiment of FIG. 8 and including the spring-lid combination described above with respect to FIG. 6A.

Figure 11:
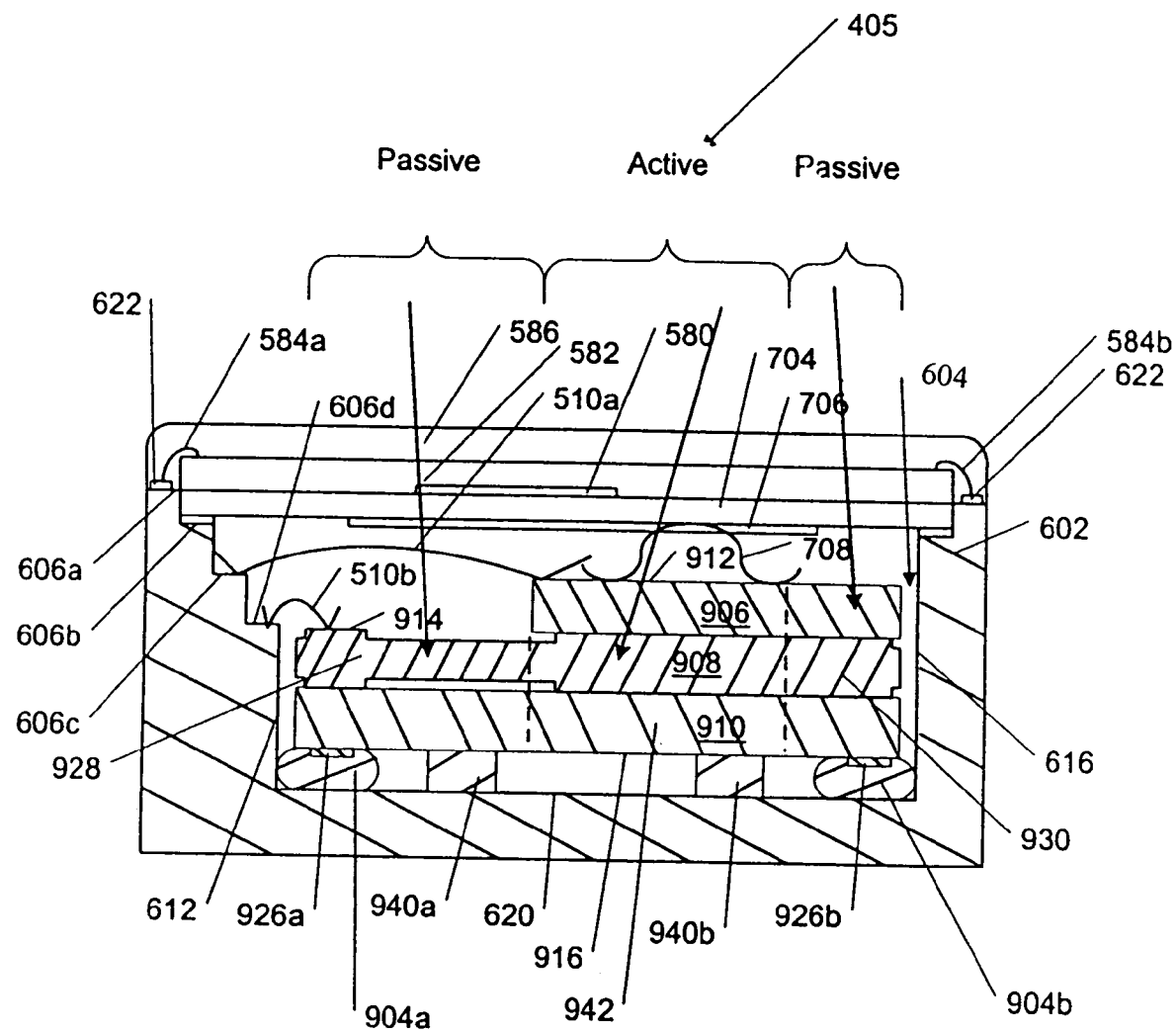
FIG. 11 is a cross-sectional view of an embodiment of the sensor package of FIG. 3.

Referring to FIG. 11, an alternate embodiment of the sensor package 405 includes the housing 602, the sensor 902, the lid assembly 702, and the controller assembly 508. The lid assembly 702 is coupled to the top of the housing 602. The controller assembly 508 is coupled to the top of the housing 602. The sensor 902 is coupled within the housing 602. This is the passive/active/passive sensor embodiment of FIG. 9 further including the spring-lid configuration of FIG. 6A.

Figure 12:
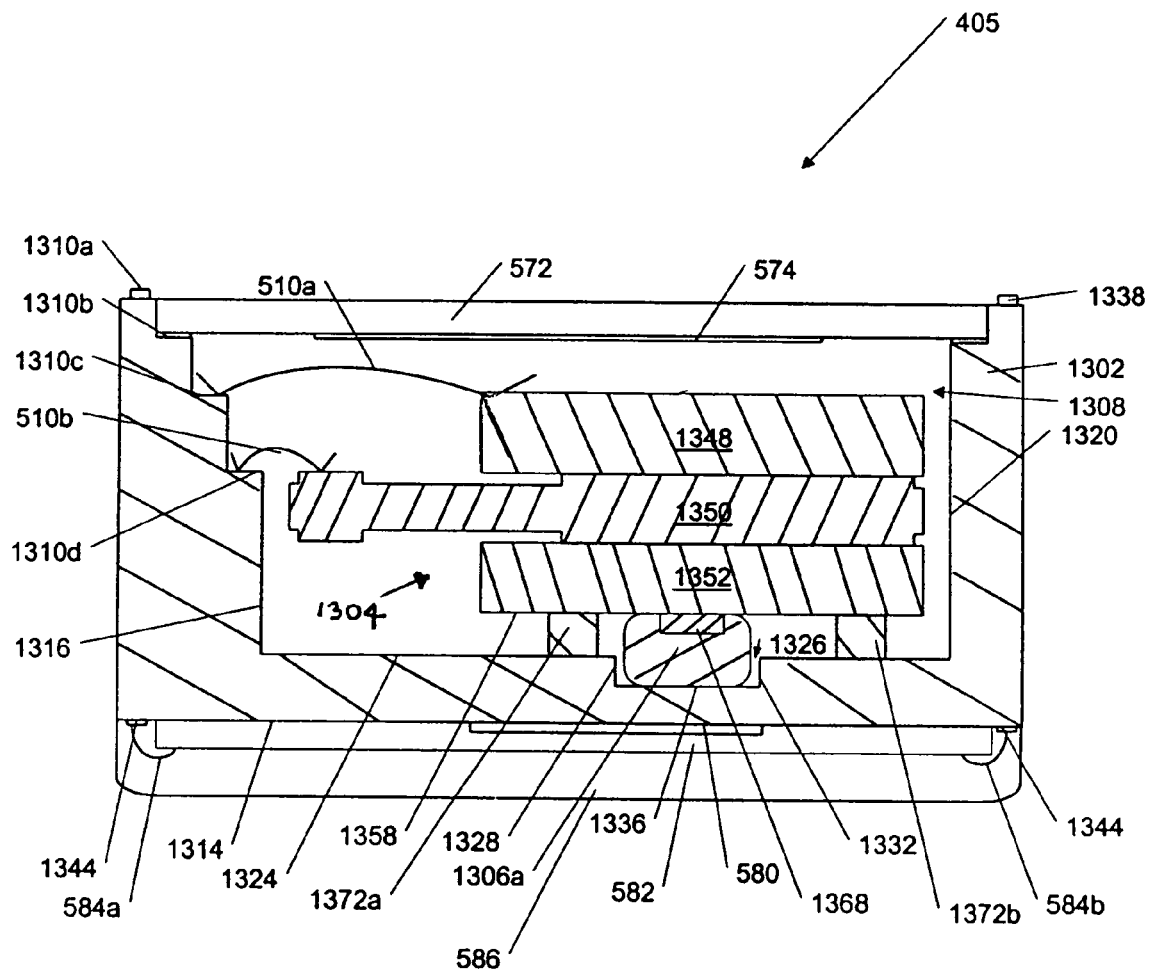
FIG. 12 is a cross-sectional view of an embodiment of the sensor package of FIG. 3.

Referring to FIG. 12, an alternate embodiment of the sensor package 405 preferably includes a housing 1302, a sensor 1304, the lid assembly 506, and the controller assembly 508. The lid assembly 506 is preferably coupled to the top of the housing 1302. The controller assembly 508 is preferably coupled to the bottom of the housing 1302. The sensor 1304 is preferably coupled within the housing 1302 such that substantially all of the sensor 1304 is an active region.

The housing 1302 is coupled to the sensor 1304, the lid assembly 506, the controller assembly 508, the electrical connections 510, one or more sliding supports 1372, and one or more resilient couplings 1306. The housing includes a cavity 1308, one or more planar surfaces 1310 and a bottom exterior surface 1314. The cavity 1308 includes a first wall 1316, a second wall (not shown), a third wall 1320 and a fourth wall (not shown). The cavity, surfaces, resilient couplings and walls are all substantially as described above with respect to FIG. 4A with only dimensional differences. A detailed description of these differences are not essential to the understanding of this embodiment.

The cavity 1308 includes a bottom surface 1324 similar in most respects to the bottom surface described above and shown in FIG. 4A. The bottom surface 1324 further includes a recess 1326 defined by a first wall 1328, a second wall (not shown), a third wall 1332, a fourth wall (not shown), and a bottom surface 1336. The recess 1326 is located approximately in the center of the bottom surface 1324 of the cavity 1308 of the housing 1302 and may be plated with a metal such as gold for soldering.

The housing 1302 includes first planar surfaces 1310a–d substantially as described with the planar surfaces of FIG. 4A. A first planar surface 1310a preferably includes one or more planar bond pads 1338.

A bottom exterior surface 1314 of the housing 1302 includes a contact pad (not shown), one or more bond pads 1344, and one or more connecting pads (not shown). All substantially as described above with respect to the embodiment of FIG. 4A.

The sensor 1304 is preferably resiliently attached to the housing 1302 by the resilient couplings 1306, slidingly supported at a bottom surface 1358 by the sliding supports 1372 and electrically coupled to the housing 1302 by the electrical connections 510. The sensor 1304 is an entirely active region.

The bond pad 1368 is similar in material to the bond pads described above with respect to FIG. 4A. The bond pad 1368 may be selected from any of several geometrical shapes such as an approximately oct-pie-wedge cross-sectional shape, an approximately hollow oct-pie-wedge cross-sectional shape, an approximately nine-circular cross-sectional shape, an approximately starburst cross-sectional shape, an approximately sunburst cross-sectional shape or any other suitable cross-sectional shape.

In an alternate embodiment, the a resilient coupling 1306 may be two resilient couplings that are substantially equal in size and are vertically proximate to each other. In several alternate embodiments, the sliding supports 1372 may have an approximately rectangular cross-sectional shape. The sliding supports 1372 may have an approximately triangular cross-sectional shape. The sliding supports 1372 may have an approximately circular cross-sectional shape.

Figure 13:
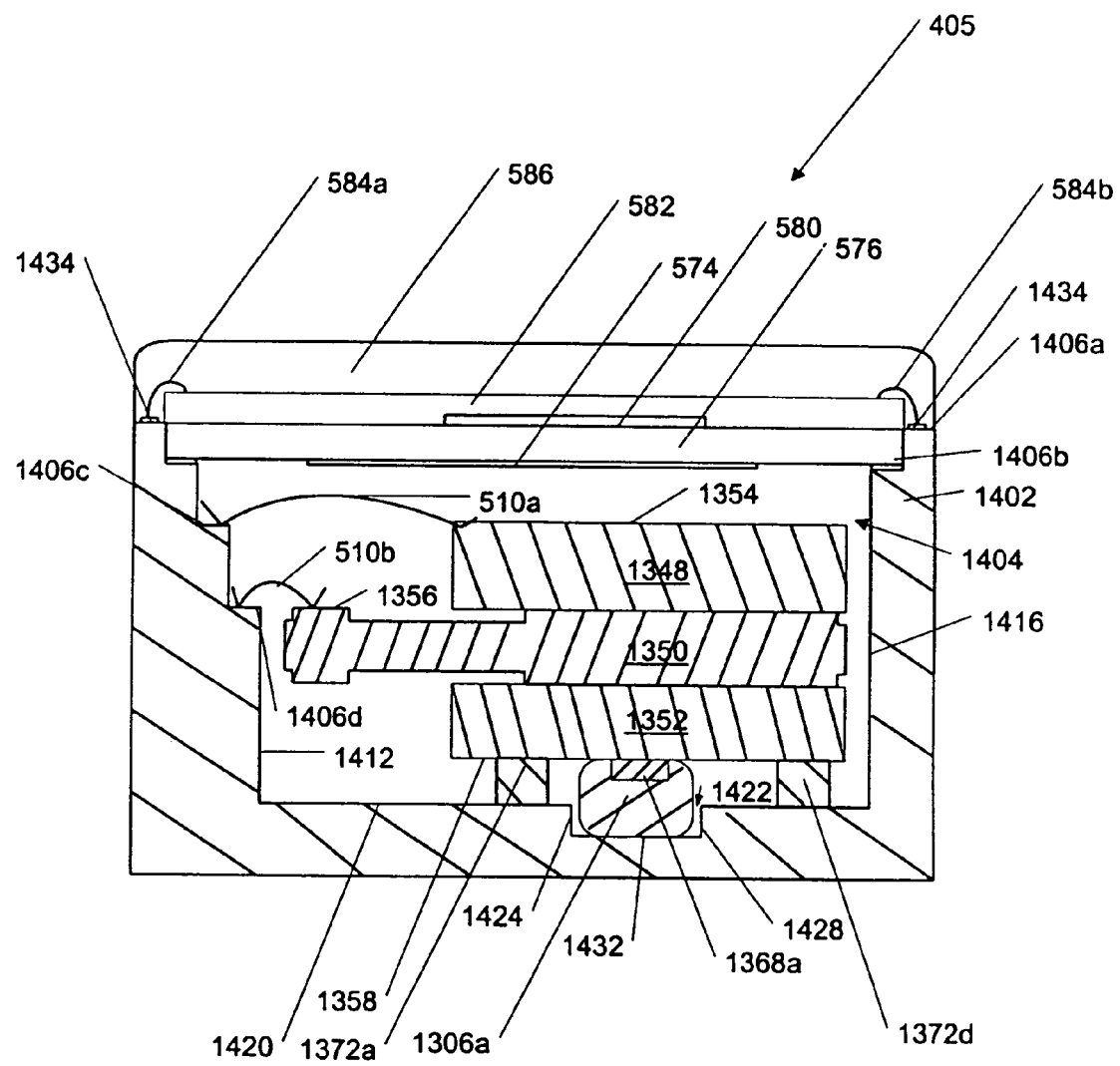
FIG. 13 is a cross-sectional view of an embodiment of the sensor package of FIG. 3.

Referring to FIG. 13, an alternate embodiment of the sensor package 405 preferably includes a housing 1402, the sensor 1304, the lid assembly 506, and the controller assembly 508. The lid assembly 506 is preferably coupled to the top of the housing 1402. The controller assembly 508 is preferably coupled to the top of the housing 1402. The sensor 1304 is preferably coupled within the housing 1402. This embodiment is the embodiment of FIG. 12 with a top-mounted controller assembly 508. All walls 1412, 1416, 1424, 1428, pads 1434, surfaces 1406, 1420, 1432, cavity 1404, housing 1402 and recess 1422 are all substantially as described above with respect to the embodiments shown in FIGS. 4A and 12.

Figure 14:
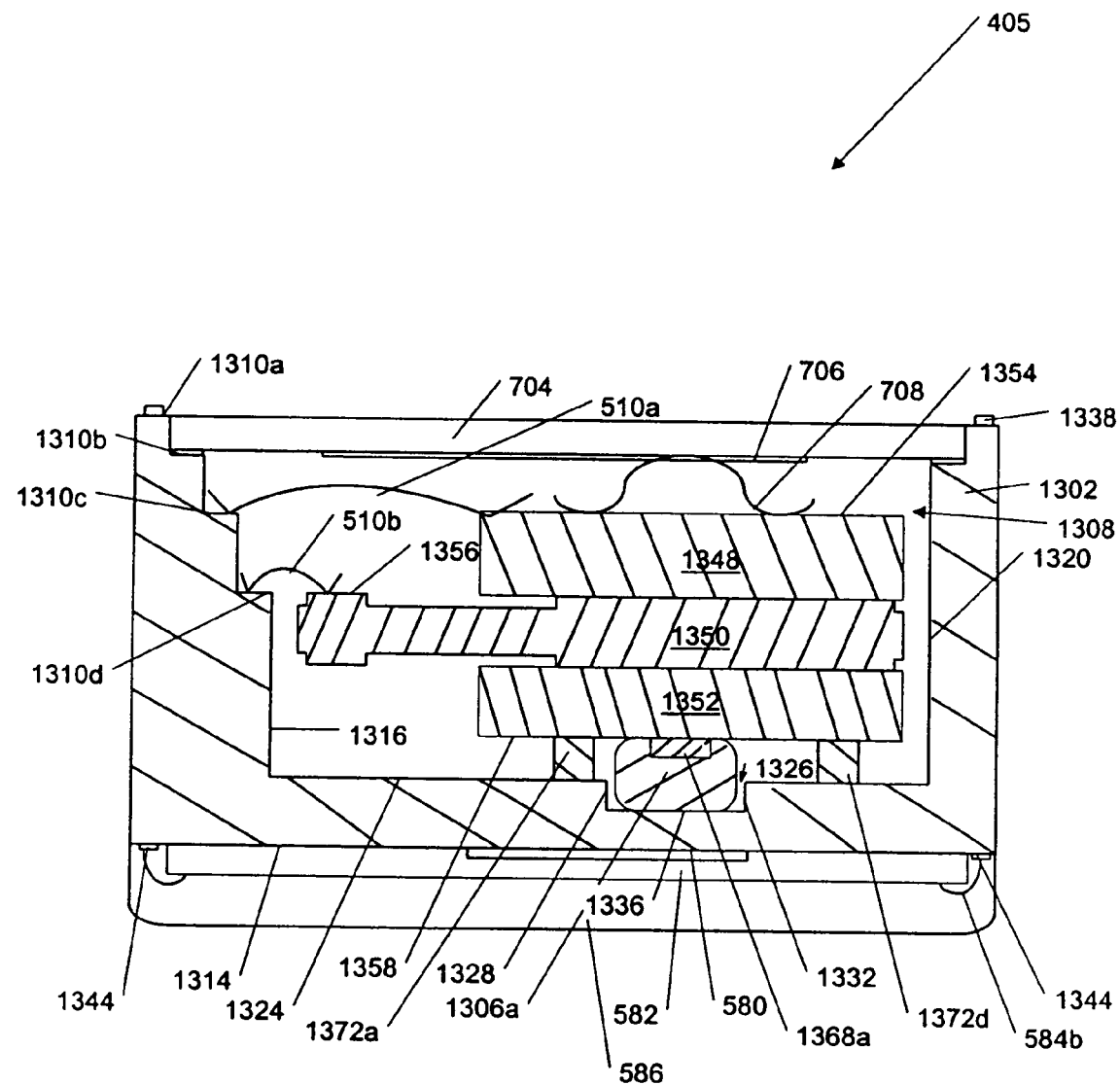
FIG. 14 is a cross-sectional view of an embodiment of the sensor package of FIG. 3.

FIG. 14 is an alternate embodiment of the sensor package 405 includes the housing 1302, the sensor 1304, the lid assembly 702, and the controller assembly 508. The lid assembly 702 is coupled to the top of the housing 1302. The controller assembly 508 is coupled to the bottom of the housing 1302. The sensor 1304 is coupled within the housing 1302. This embodiment is the embodiment of FIG. 12 incorporating the spring-lid assembly as described above and shown in FIG. 6A.

Figure 15:
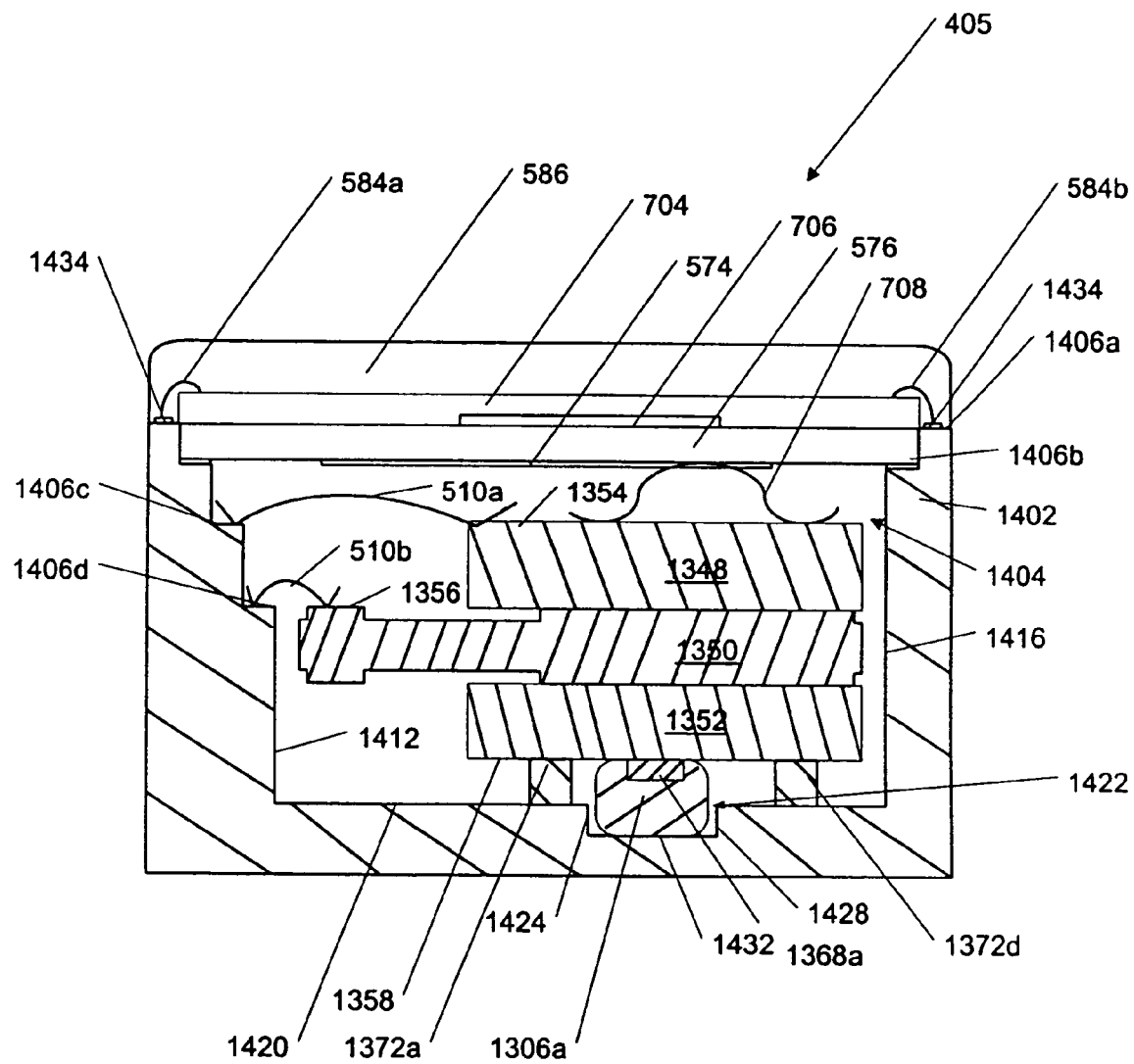
FIG. 15 is a cross-sectional view of an embodiment of the sensor package of FIG. 3.

FIG. 15 is an alternate embodiment of the sensor package 405 includes the housing 1402, the sensor 1304, the lid assembly 702, and the controller assembly 508. The lid assembly 702 is coupled to the top of the housing 1402. The controller assembly 508 is coupled to the top of the housing 1402. The sensor 1304 is coupled within the housing 602. This embodiment is the embodiment of FIG. 14, but having a top-mounted controller assembly 508 as described above and shown in FIG. 5A.

Figure 16A:
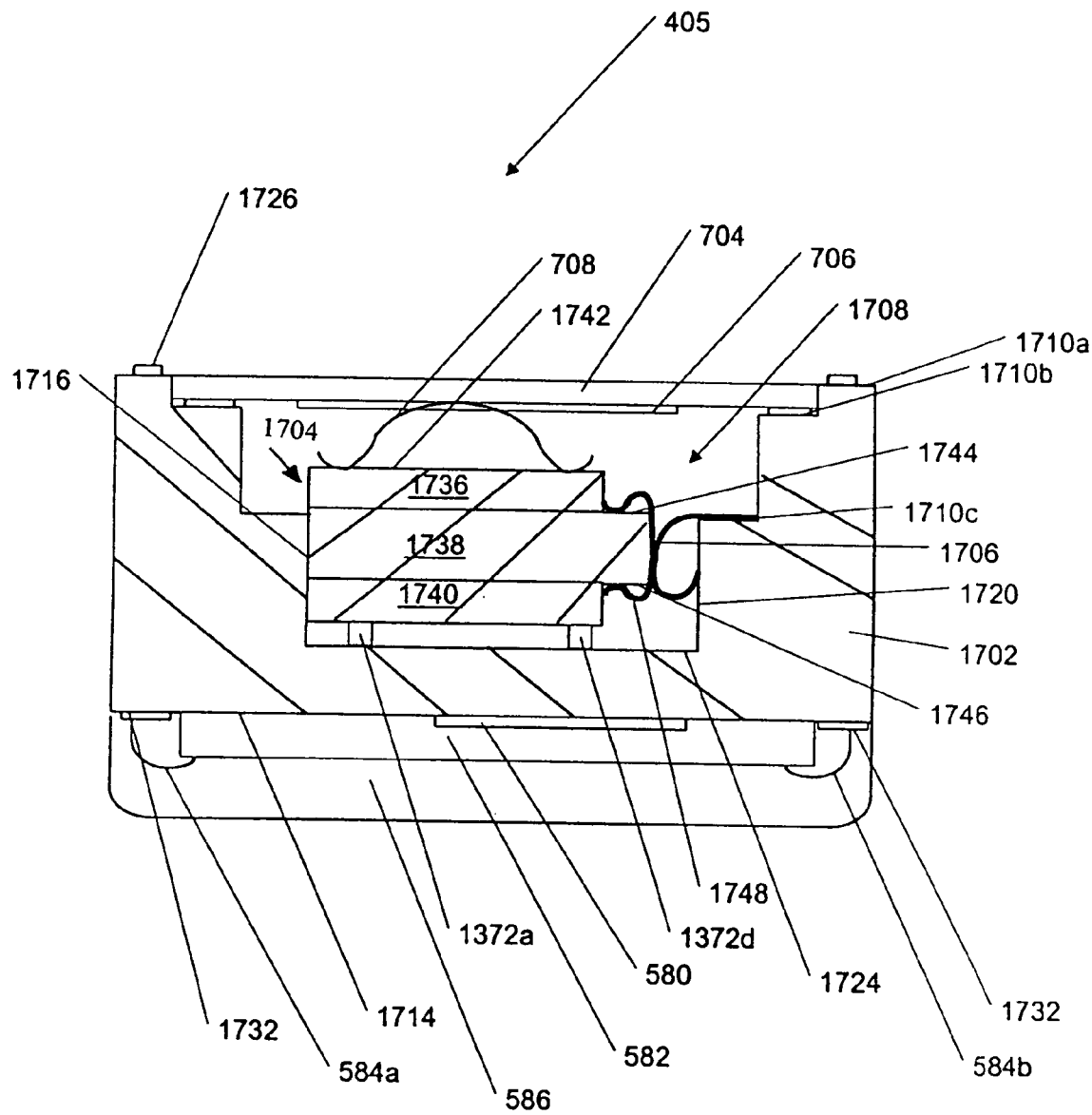
FIG. 16A is a cross-sectional view of an embodiment of the sensor package of FIG. 3.
Figure 16B:
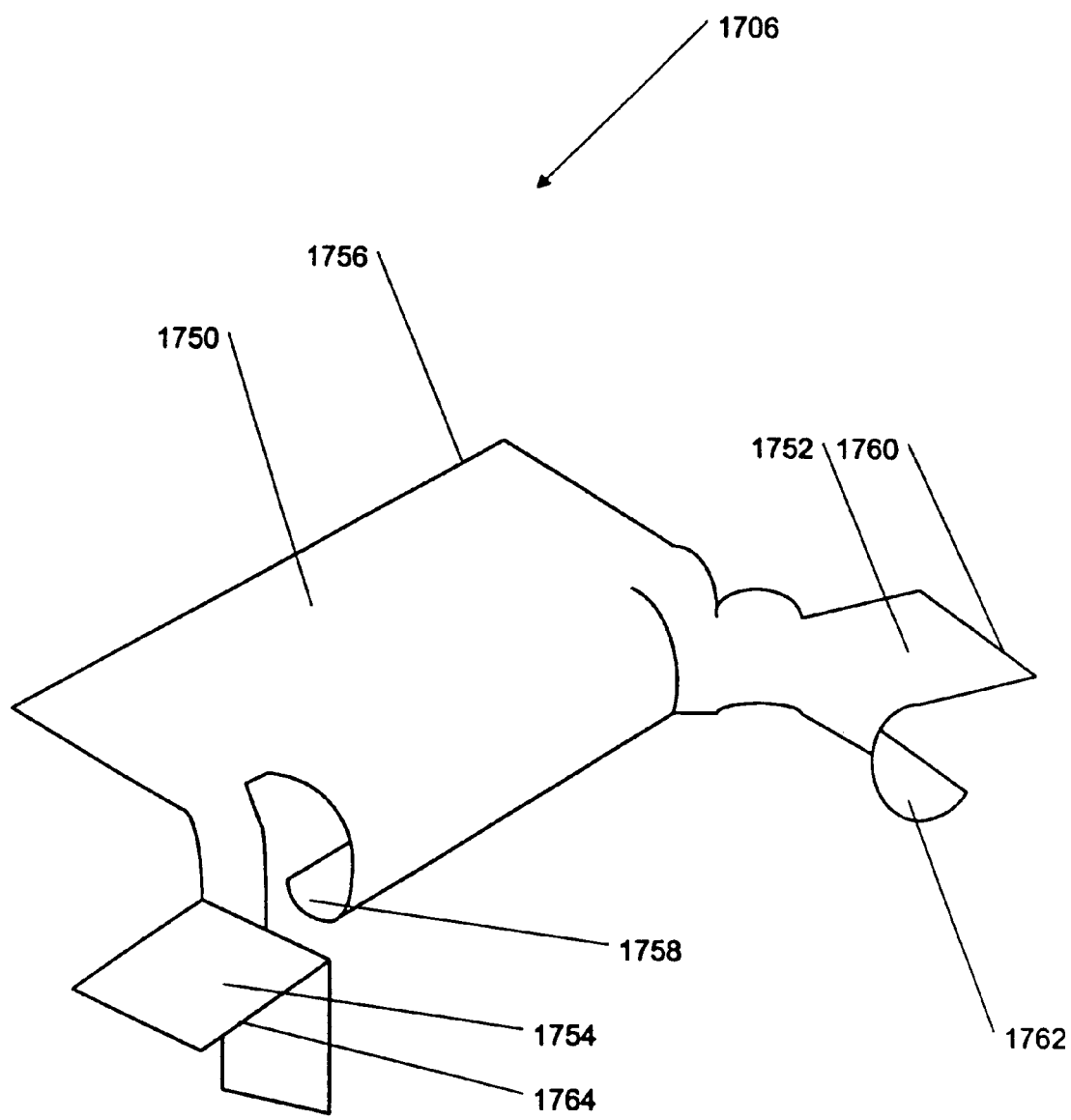
FIG. 16B is a schematic view of an embodiment of the spring assembly of the sensor package of FIG. 16A.
Figure 16C:
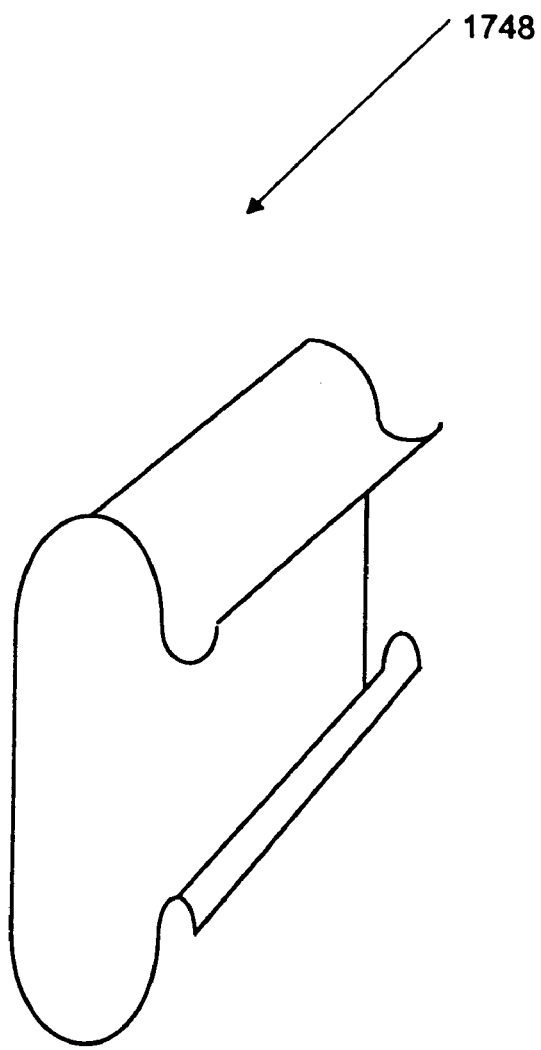
FIG. 16C is a schematic view of an embodiment of the shorting clip of the sensor package of FIG. 16A.

Referring to FIGS. 16A through 16C, an alternate embodiment of the sensor package 405 includes a housing 1702, a sensor 1704, the lid assembly 702, and the controller assembly 508. The lid assembly 702 is coupled to the top of the housing 1702. The controller assembly 508 is coupled to the bottom of the housing 1702. The sensor 1704 is coupled within the housing 1702.

The packaging of the housing 1702, the sensor 1704, and the lid assembly 702 are the sensor package arrangement substantially as disclosed in copending U.S. patent application Ser. No. 08/935,093, filed on Sep. 25, 1997, the contents of which are incorporated herein by reference. All walls 1716, 1720, pads 1726, 1732, surfaces 1710, 1714, 1724, 1742, 1744, 1746, cavity 1708, housing 1702, sensor 1704, and sensor members 1736, 1738, 1740 are all substantially as described above with respect to the embodiments shown in FIG. 4A with differences being only in the number and dimensions of the elements.

The sensor 1704 is preferably coupled to the housing 1702 via a spring assembly 1706 and a shorting clip 1748. The spring assembly 1706 is fabricated from one piece of spring material which is bent into a middle spring member 1750, a side spring member 1752 and a side support member 1754. The middle spring member 1750 is approximately perpendicular to both the side spring member 1752 and the side support member 1754. The middle spring member 1750 has a flat top surface 1756 that curls down to a loop 1758.

The side spring member 1752 has a flat top surface 1760 that curls down to a loop 1762. The side support member 1754 has a flat top surface 1764 that bends down at a right angle.

The spring assembly 1706 is inserted into the cavity 1708. The middle spring member 1750 flat top surface 1756, the side spring member 1752 flat top surface 1760, and the side support member 1754 flat top surface 1764 are coupled to the third planar surface 1710c of the housing 1702. In one embodiment, the spring assembly 1706 is welded to the third planar surface 1710c of the housing 1702 to provide mechanical and electrical connection to the sensor 1704. The middle spring member 1750 loop 1758 and the side spring member 1752 loop 1762 secure the sensor 1704 within the cavity 1708 of the housing 1702.

The shorting clip 1748 extends around the first middle planar surface 1744 of the sensor 1704 and the second middle planar surface 1746 of the sensor 1704. The shorting clip 1748 contacts the spring assembly 1706 securing the sensor 1704 within the cavity 1708 of the housing 1702 providing a conductive pathway between the center member 1738 of the sensor 1704, to the third planar surface 1710c of the housing 1702. The shorting clip 1748 may be fabricated using stainless steel or beryllium copper strip. Using stainless steel for the shorting clip 1748 provides good mechanical strength and stable properties.

Figure 17:
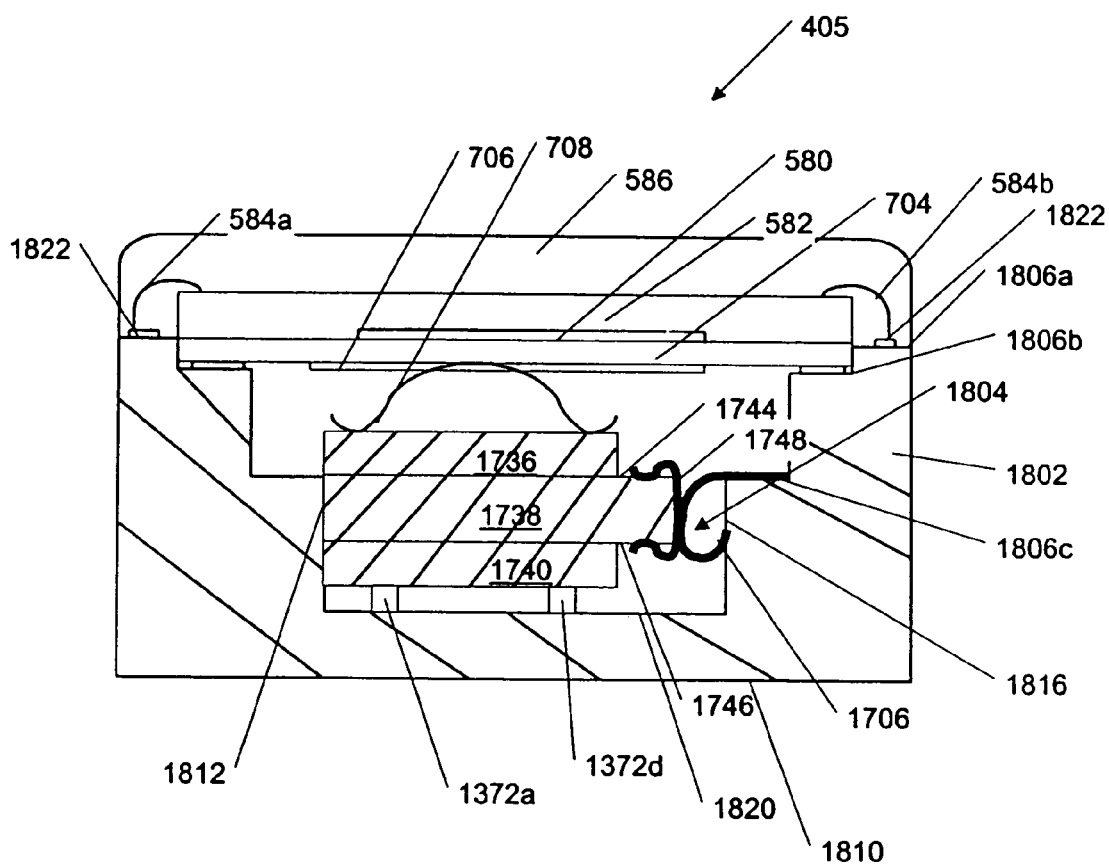
FIG. 17 is a cross-sectional view of an embodiment of the sensor package of FIG. 3.

FIG. 17 is an alternate embodiment of the sensor package 405 includes a housing 1802, the sensor 1704, the lid assembly 702, and the controller assembly 508. The lid assembly 702 is coupled to the top of the housing 1802. The controller assembly 508 is coupled to the top of the housing 1802. The sensor 1704 is coupled within the housing 1802. This embodiment is the embodiment of FIG. 16A having a top-mounted controller assembly 508.

Figure 18:
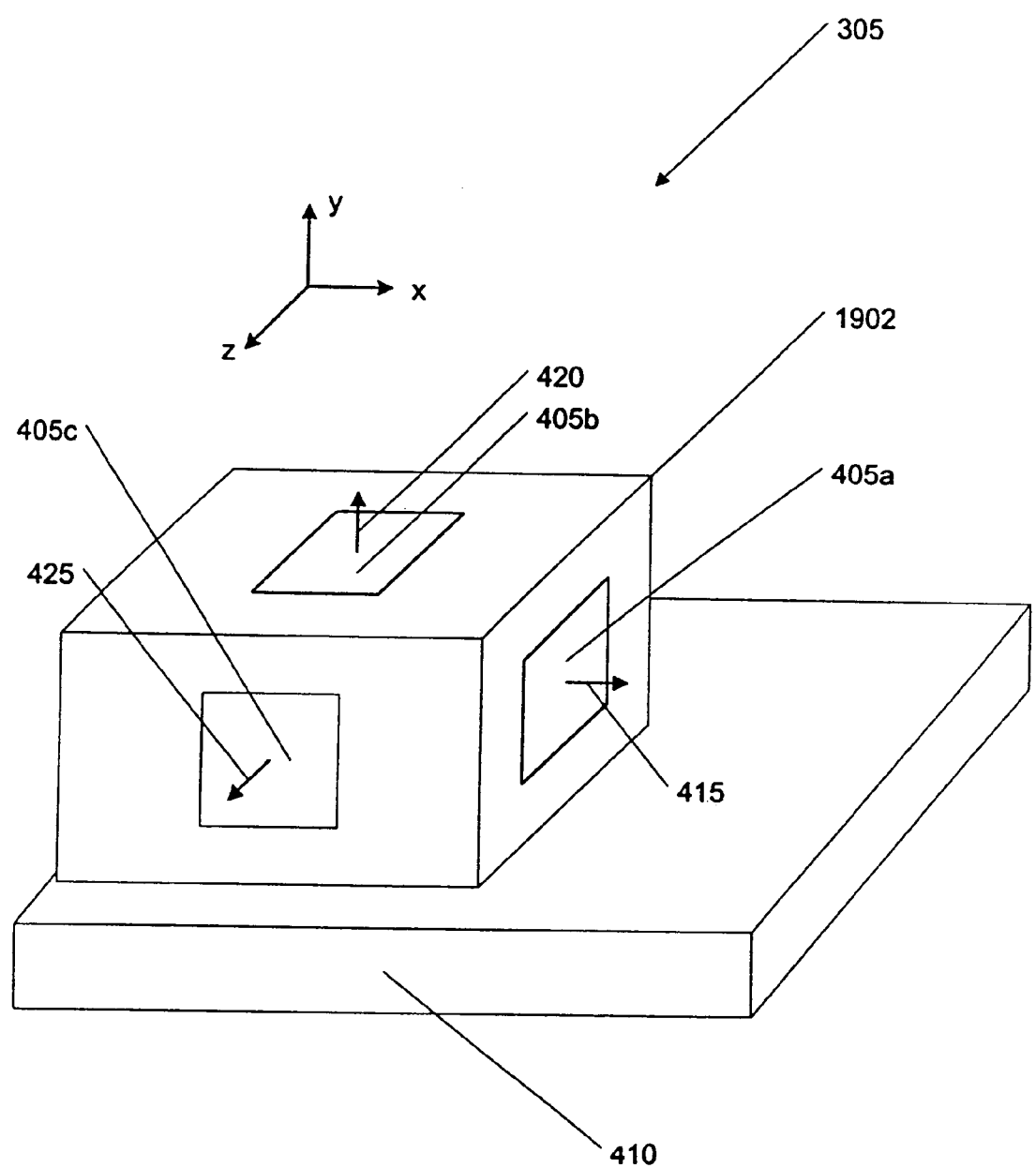
FIG. 18 is a schematic view of an alternate embodiment of the sensor module of FIG. 2.

Referring to FIG. 18, an alternate embodiment of the sensor module 305 includes the sensor packages 405, a substrate 410, and a monolithic package 1902. The sensor packages 405 are coupled to the monolithic package 1902. In one embodiment, the sensor module 305 includes a first sensor package 405a, a second sensor package 405b, and a third sensor package 405c. The first sensor package 405a includes an axis of sensitivity 415. The axis of sensitivity 415 is approximately parallel to the x-axis. The first sensor package 405a is coupled to the monolithic package 1902 to maintain the axis of sensitivity 415 parallel to the x-axis. The second sensor package 405b includes an axis of sensitivity 420. The axis of sensitivity 420 is approximately parallel to the y-axis. The second sensor package 405b is coupled to the monolithic package 1902 to maintain the axis of sensitivity 420 parallel to the y-axis. The third sensor package 405c includes an axis of sensitivity 425. The axis of sensitivity 425 is approximately parallel to the z-axis. The third sensor package 405c is coupled to the monolithic package 1902 to maintain the axis of sensitivity 425 parallel to the z-axis.

The sensor packages 405 may be coupled to the monolithic package 1902 using one of the following methods: integrated as part of the monolithic package 1902, rigidly attached to the monolithic package 1902, or removably attached to the monolithic package 1902. In one embodiment, the sensor packages 405 are coupled to the monolithic package 1902 by removably attaching the sensor packages 405 into the monolithic package 1902 for cost-effectiveness and good manufacturability. In several alternate embodiments, the removable attachment methods include socketing, screw attaching or other mechanical attachment methods.

The monolithic package 1902 may be plastic, ceramic, or metal. In one embodiment, the monolithic package 1902 is plastic to provide ease of manufacturing and cost effectiveness. The monolithic package 1902 may be a hollow frame, a box, a three-dimensional circuit board, a cylinder, or a cube. The monolithic package 1902 is coupled to the substrate 410. The monolithic package 1902 may be coupled to the substrate 410 using one of the following methods: solder-paste surface mount, solder-ball, leads, connectors, epoxies, mechanical connections or wire bonding. The monolithic package 1902 is coupled to the substrate 410 by leads to provide cost effectiveness and good manufacturability.

In several alternate embodiments, rigidly attaching the sensor packages 405 to the monolithic package 1902 includes using solder, epoxies, or glass frit bonding.

In several alternate embodiments, the monolithic package 1902 includes recesses adapted to receive the sensor packages 405.

In several alternate embodiments, the sensor packages 405 may be the sensors 504, 902, 1304, or 1704 as described above with reference to FIGS. 4A, 8, 12 and 16A. The sensors 504, 902, 1304, or 1704 may be coupled to the monolithic package 1902 by methods substantially as described above in any of the preceding embodiments. In an alternate embodiment, the sensors 504, 902, 1304, or 1704 are further vacuum-sealed into the monolithic package 1902.

Figure 19:
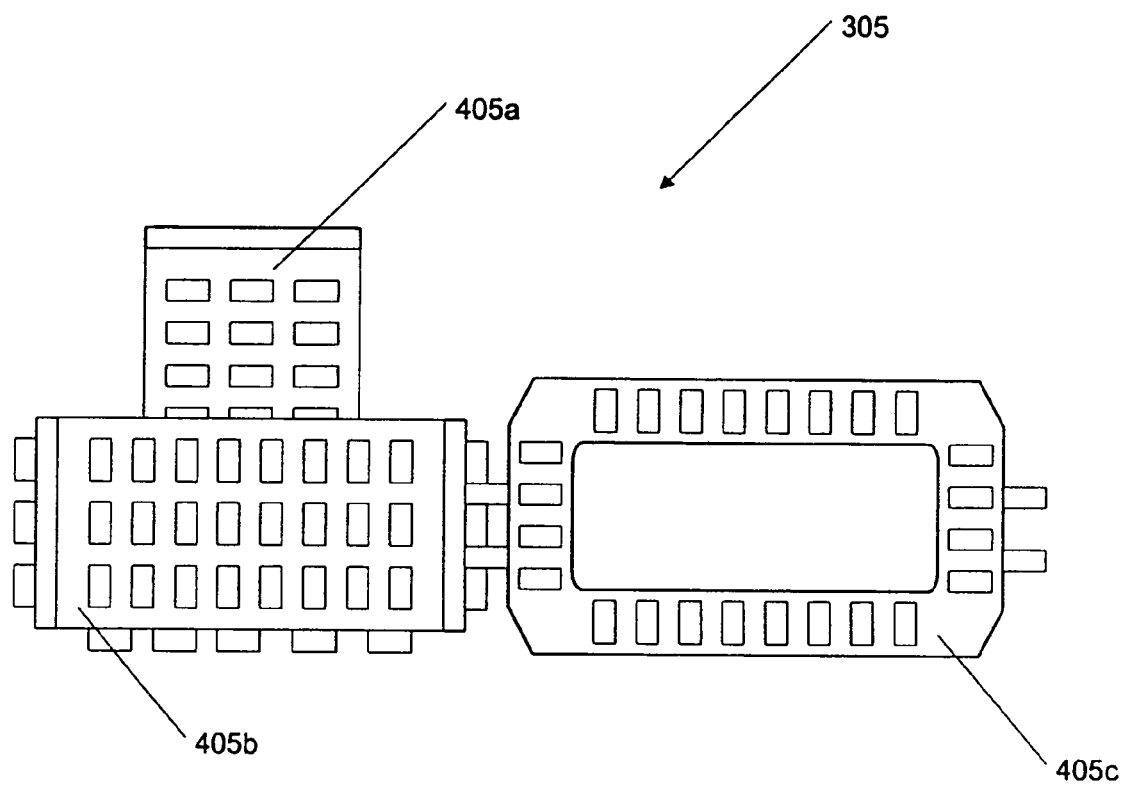
FIG. 19 is a schematic view of an alternate embodiment of the sensor module of FIG. 2.

Referring to FIG. 19, an alternate embodiment of the sensor module 305 includes one or more sensor packages 405. The sensor packages 405 are coupled to each other. In one embodiment, the sensor module 305 includes the first sensor package 405a, the second sensor package 405b, and the third sensor package 405c. The first sensor package 405a includes an axis of sensitivity 415. The axis of sensitivity 415 is approximately parallel to the x-axis. The first sensor package 405a is coupled to the second sensor package 405b to maintain the axis of sensitivity 415 parallel to the x-axis. The second sensor package 405b includes an axis of sensitivity 420. The axis of sensitivity 420 is approximately parallel to the y-axis. The second sensor package 405b is coupled to the first sensor package 405a and the third sensor package 405c to maintain the axis of sensitivity 420 parallel to the y-axis. The third sensor package 405c includes an axis of sensitivity 425. The axis of sensitivity 425 is approximately parallel to the z-axis. The third sensor package 405c is coupled to the second sensor package 405b to maintain the axis of sensitivity 425 parallel to the z-axis. The sensor packages 405 may be coupled to each other using one of the following methods: solder, epoxy, or mechanical attachment. In one embodiment, the sensor packages 405 are coupled to each other by solder for good manufacturability.

Figure 20A:
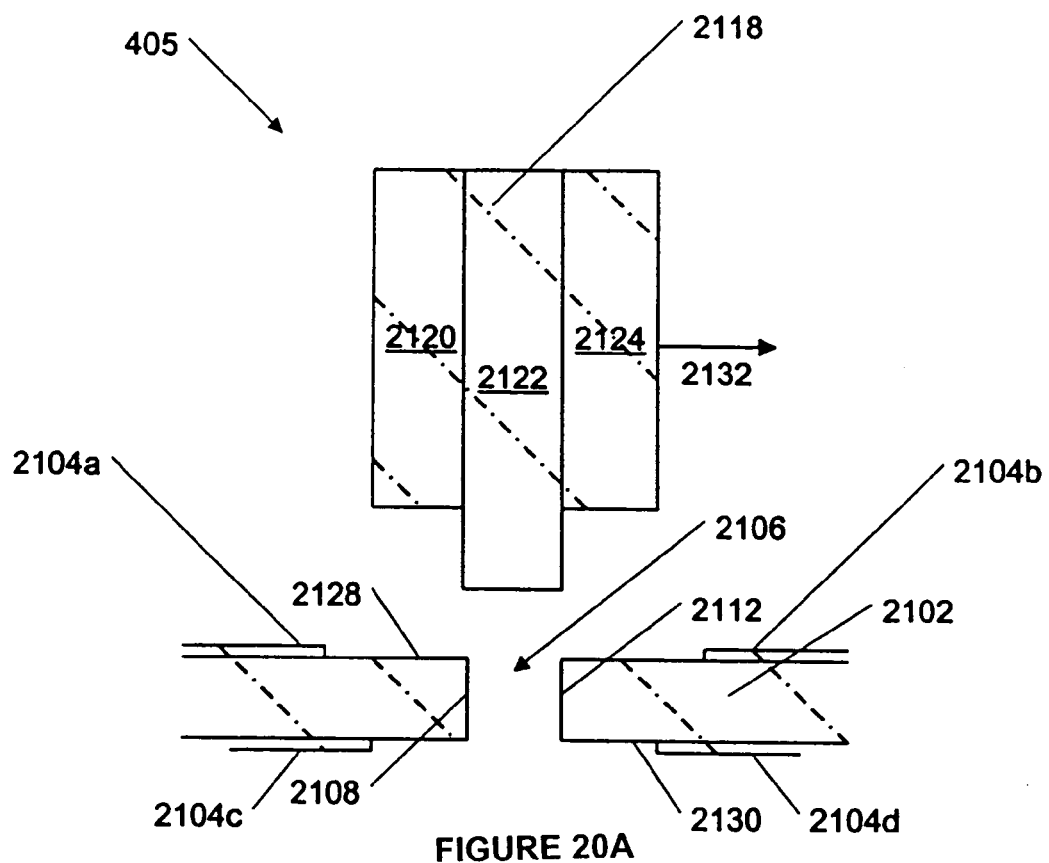
FIG. 20A is a cross-sectional view of an alternate embodiment of the sensor package of FIG. 3 before coupling.
Figure 20B:
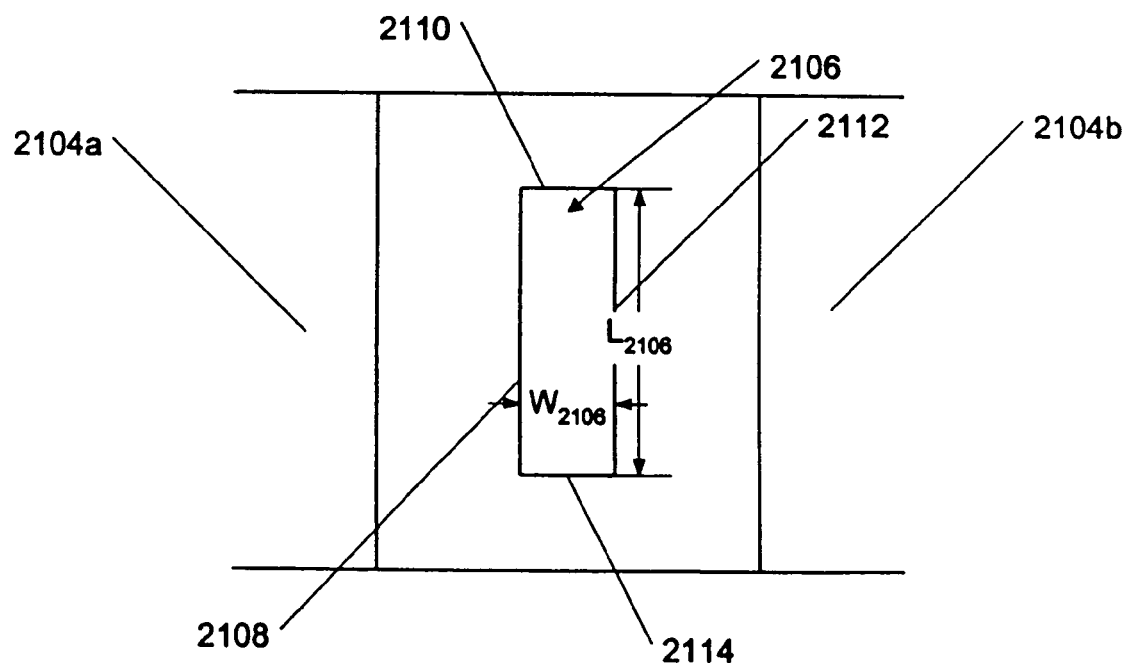
FIG. 20B is a top view of an embodiment of the sensor package of FIG. 20A.
Figure 20C:
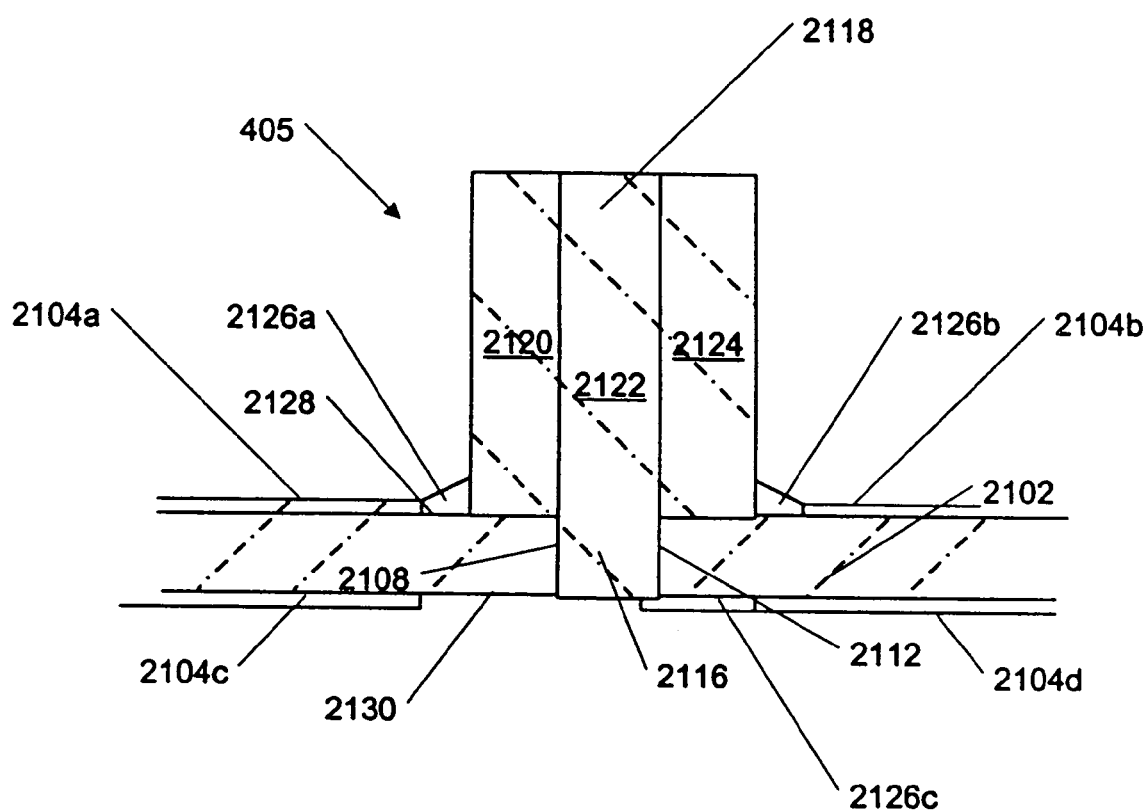
FIG. 20C is a cross-sectional view of an embodiment of the sensor package of FIG. 20A after coupling.

Referring to FIGS. 20A through 20C, in an alternate embodiment, the sensor package 405 includes one or more substrates 2102 and one or more sensors 2118. The substrates 2102 are coupled to the sensors 2118.

The substrates 2102 may be ceramic, PC-board or silicon. In one embodiment, there is a single substrate 2102. The substrate 2102 includes a top planar surface 2128 and a bottom planar surface 2130. The top planar surface 2128 includes one or more traces 2104. The bottom planar surface includes one or more traces 2104. The traces 2104 may be aluminum, copper or gold. In one embodiment, the traces 2104 are gold for conductivity and solder interconnection. The number of traces 2104 depends on having sufficient traces 2104 to couple the sensor 2118 to the package 2102.

The substrate 2102 further includes one or more slots 2106. The slots 2106 include a first wall 2108, a second wall 2110, a third wall 2112, and a fourth wall 2114. The first wall 2108 and the third wall 2112 are approximately parallel to each other and the second wall 2110 and the fourth wall 2114 are approximately parallel to each other. The second wall 2110 and the fourth wall 2114 wall are also perpendicular to the first wall 2108 and the third wall 2112. The slots 2106 are adapted to receive the sensors 2118. The length of the slot $L_{2106}$ may range, for example, from about 5000 to 15000 microns. In one embodiment, the length of the slot $L_{2106}$ ranges from about 5000 to 7000 microns to facilitate vertical alignment. The width of the slot $W_{2106}$ may range, for example, from about 500 to 2000 microns. In one embodiment, the width of the slot $W_{2106}$ ranges from about 1000 to 1200 microns to facilitate vertical alignment.

The sensors 2118 are coupled to the substrate 2102. The sensors 2118 have an approximately rectangular cross-sectional shape. In one embodiment, the sensors 2118 includes a first member 2120, a second member 2122, and a third member 2124. The first member 2120 is on top of the second member 2122 and the second member 2122 is on top of the third member 2124. In one embodiment, the first member 2120, the second member 2122, and the third member 2124 are a micro machined sensor substantially as described above.

The sensors 2118 further include an axis of sensitivity 2132. The sensors 2118 are coupled to substrate 2102 to maintain the axis of sensitivity 2132 parallel to the substrate 2102. The second member 2122 has an extended tab 2116. The extended tab 2116 is adapted to insert into the slots 2106 of the substrate 2102. The sensors 2122 are resiliently coupled to the substrate 2102 by one or more connections 2126. The connections 2126 may be micro-welding, solder pastes or conductive adhesive. In one embodiment, the connections 2126 are solder paste for tensile strength. The solder pastes 2126 may be eutectic or non-eutectic. In one embodiment, the solder pastes 2126 are eutectic to provide temperature hierarchy and tensile strength. The solder pastes 2126 couple one or more traces 2104 to the sensor 2122. In one embodiment, there is a first trace 2104a, a second trace 2104b, a third trace 2104c and a fourth trace 2104d. The first trace 2104a is located on the top planar surface 2128 and is coupled to the first member 2120. The second trace 2104b is located on the top planar surface 2128 and is coupled to the third member 2124. The third trace 2104c may be a redundant connection to the second member 2122 or not used. The fourth trace 2104d is located on the bottom planar surface 2130 and is coupled to second member 2122.

Figure 20D:
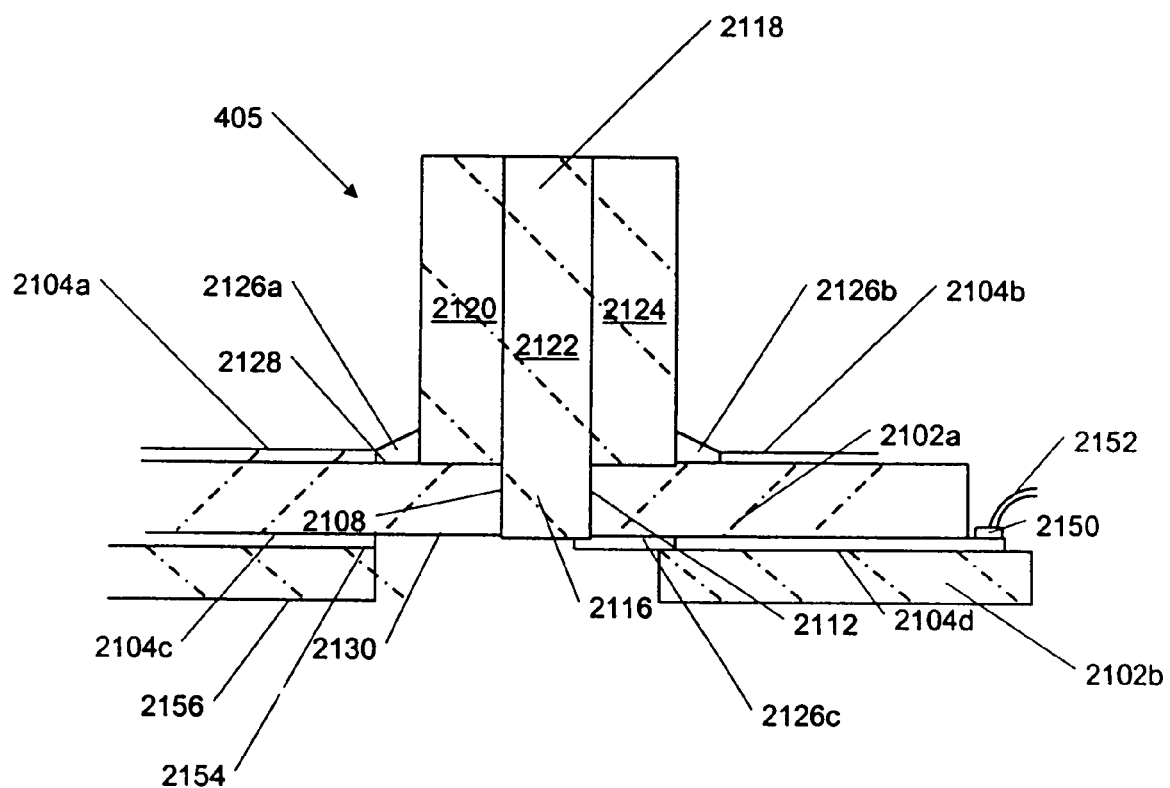
FIG. 20D is a cross-sectional view of an alternate embodiment of the sensor package of FIG. 20A.
Figure 21A:
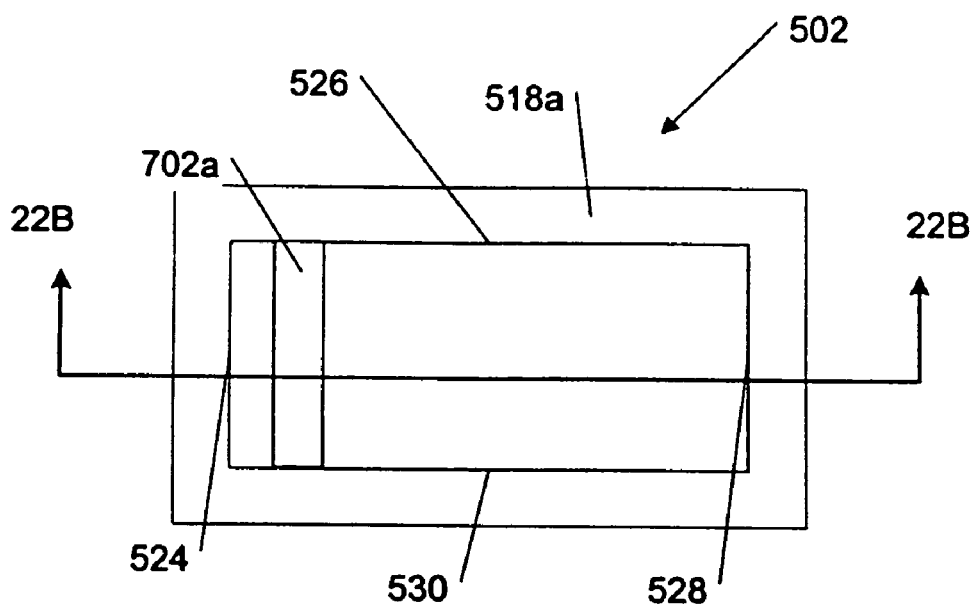
FIG. 21A is a top view of an alternate embodiment of the apparatus of FIG. 4A.
Figure 21B:
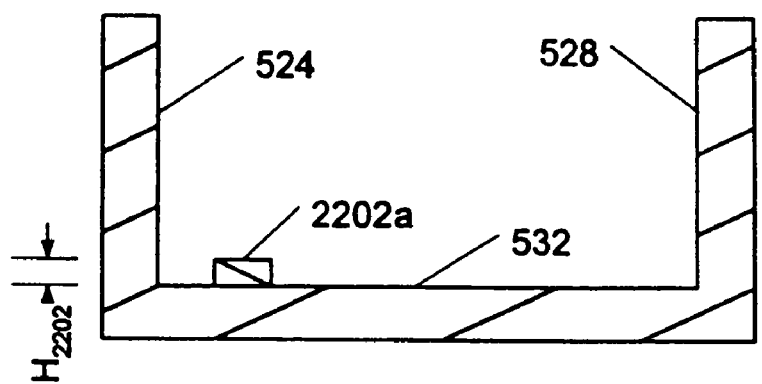
FIG. 21B is a cross-sectional view of the apparatus of FIG. 21A.
Figure 21C:
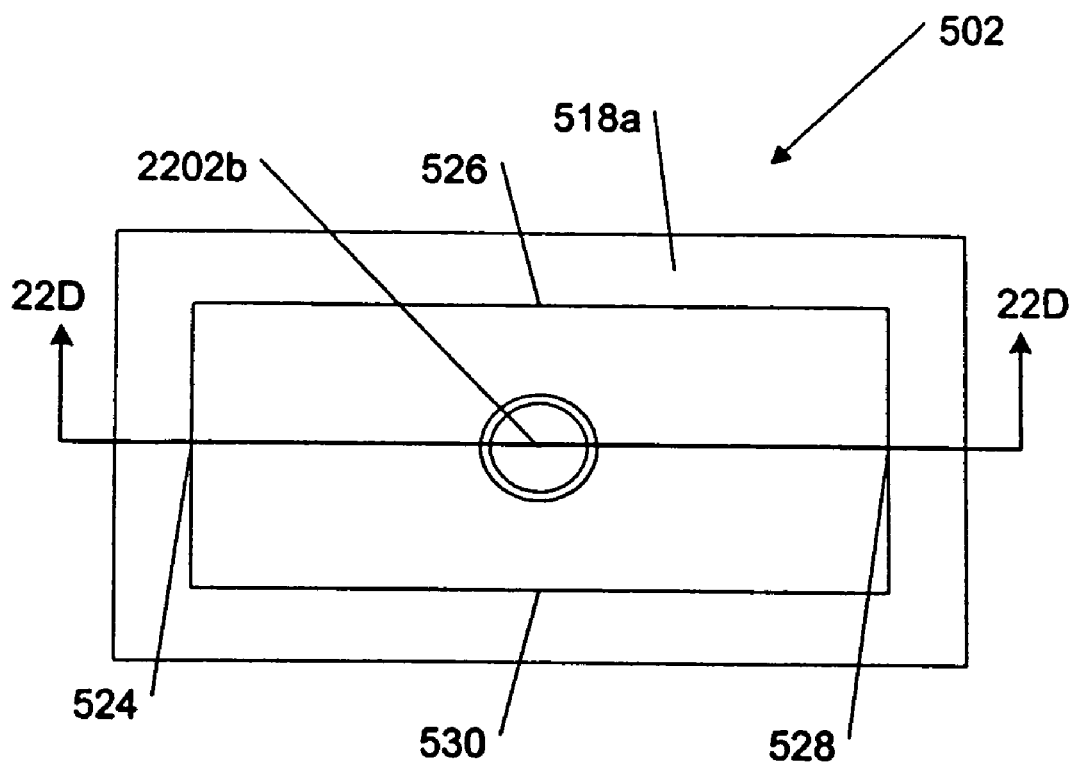
FIG. 21C is a top view of an alternate embodiment of the apparatus of FIG. 4A.
Figure 21D:
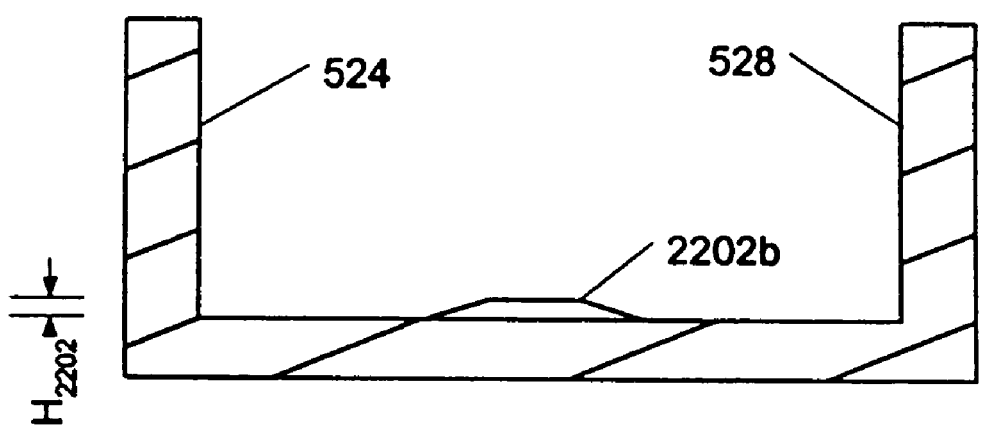
FIG. 21D is a cross-sectional view of the apparatus of FIG. 21C.

Referring to FIG. 20D, in an alternate embodiment, the sensor package 405 as referenced to in FIGS. 20A through 20C, includes a first substrate 2102a and a second substrate 2102b. The second substrate includes a top planar surface 2154 and a bottom planar surface 2156. The third trace 2104c and the fourth trace 2104d may be coupled to the second substrate 2102b, for example, by solder paste, conductive epoxy, or wafer bonding techniques. The fourth trace 2104d may be located on the top planar surface 2154 of the second substrate 2102b or on the bottom planar surface 2130 of the first substrate 2102a. The fourth trace 2104d couples the second member 2122 to a bond pad 2150. The bond pad 2150 may be coupled to a bond wire 2152. The sensor package 405 may be surface or flush mounted. The sensor 2118 has one or more leads coming from the first member 2120 and the third member 2124. The substrate 2102b acts like a mechanical spacer.

Referring to FIGS. 21A through 21D, in several alternate embodiments, the housings 502, 602, 1302, and 1402, as described above with reference to FIGS. 4A, 5A, 12 and 13, include one or more pedestals 2202a or 2202b for supporting one or more resilient couplings. The pedestals 2202a and 2202b may be fabricated from, for example, tungsten or ceramic. In one embodiment, the pedestals 2202a and 2202b are fabricated from ceramic. The height $H_{2202}$ of the pedestals 2202a and 2202b may range, for example, from about 0 to 10 mils. In one embodiment, the height $H_{2202}$ of the pedestals 2202a and 2202b is approximately 5 mils. The pedestal 2202a is a rectangular shaped support pipe having straight edges. In an alternate embodiment, the pedestal 2202b is a cylindrical section having tapered sides. In an alternate embodiment, the pedestal 2202b has straight sides. In one embodiment, the pedestals 2202a and 2202b have a shape selected to reduce the thermal stresses between the pedestals 2202a and 2202b and the resilient couplings it supports.

Figure 22A:
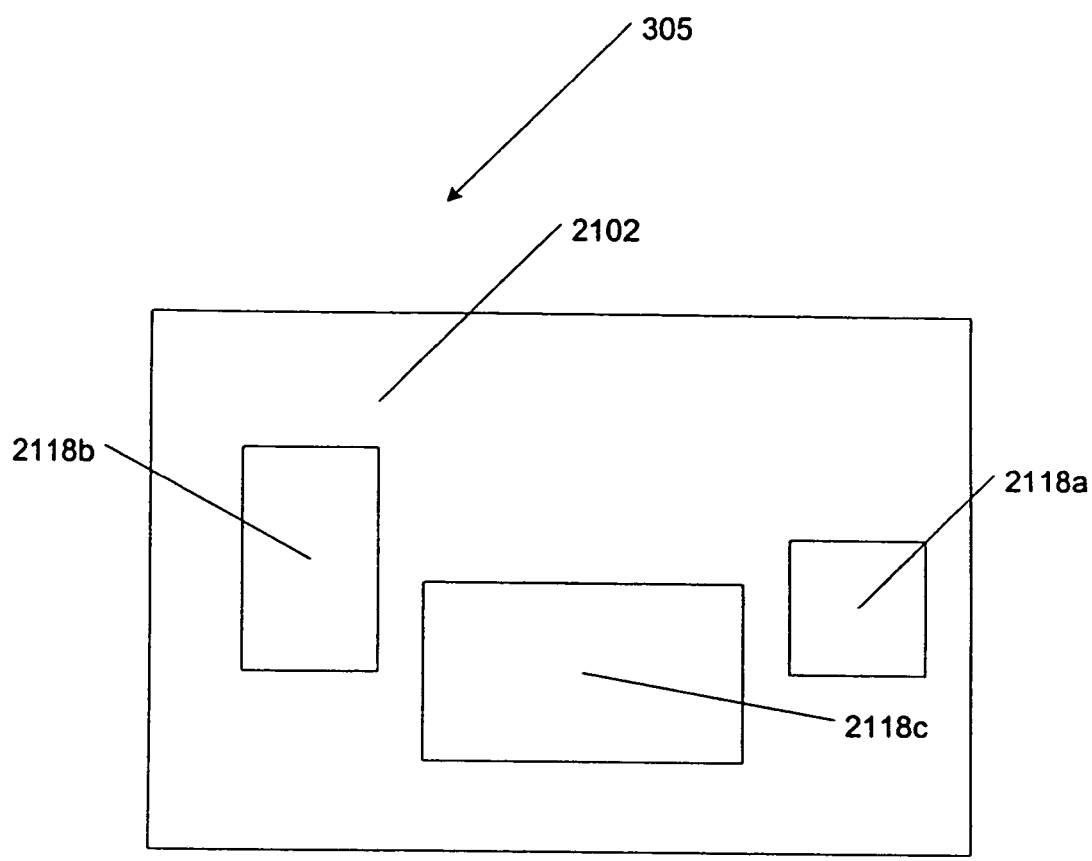
FIG. 22A is a top view of an alternate embodiment of the sensor module of FIG. 2.
Figure 22B:
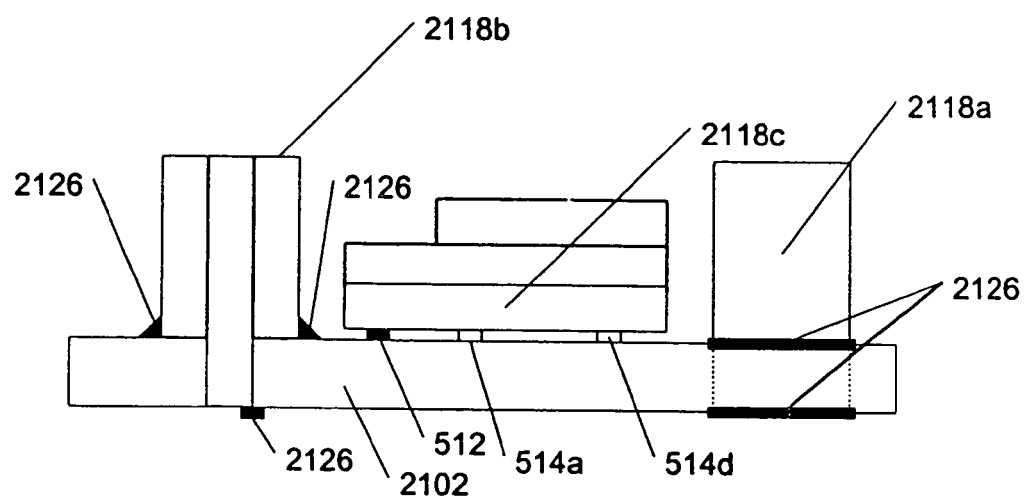
FIG. 22B is a cross-sectional view of an alternate embodiment of the sensor module of FIG. 22A.

Referring to FIGS. 22A and 22B, in an alternate embodiment, the sensor module 305 includes the substrate 2102 and one or more sensors 2118. In one embodiment, there is a first sensor 2118a, a second sensor 2118b, and a third sensor 2118c. The first sensor 2118a and the second sensor 2118b are inserted into one or more slots 2106 and resiliently coupled to the substrate 2102 by one or more solder pastes 2126 as previously described above with reference to FIGS. 20A through 20D. The third sensor 2118c is resiliently coupled to the substrate 2102 using any of the resilient couplings 512, 904 or 1306 as described above. The third sensor 2118c is also slidingly supported by the sliding supports 514, 940, or 1372 as described above. In an alternate embodiment, the sliding supports 514, 940, or 1372 are optional.

Figure 23:
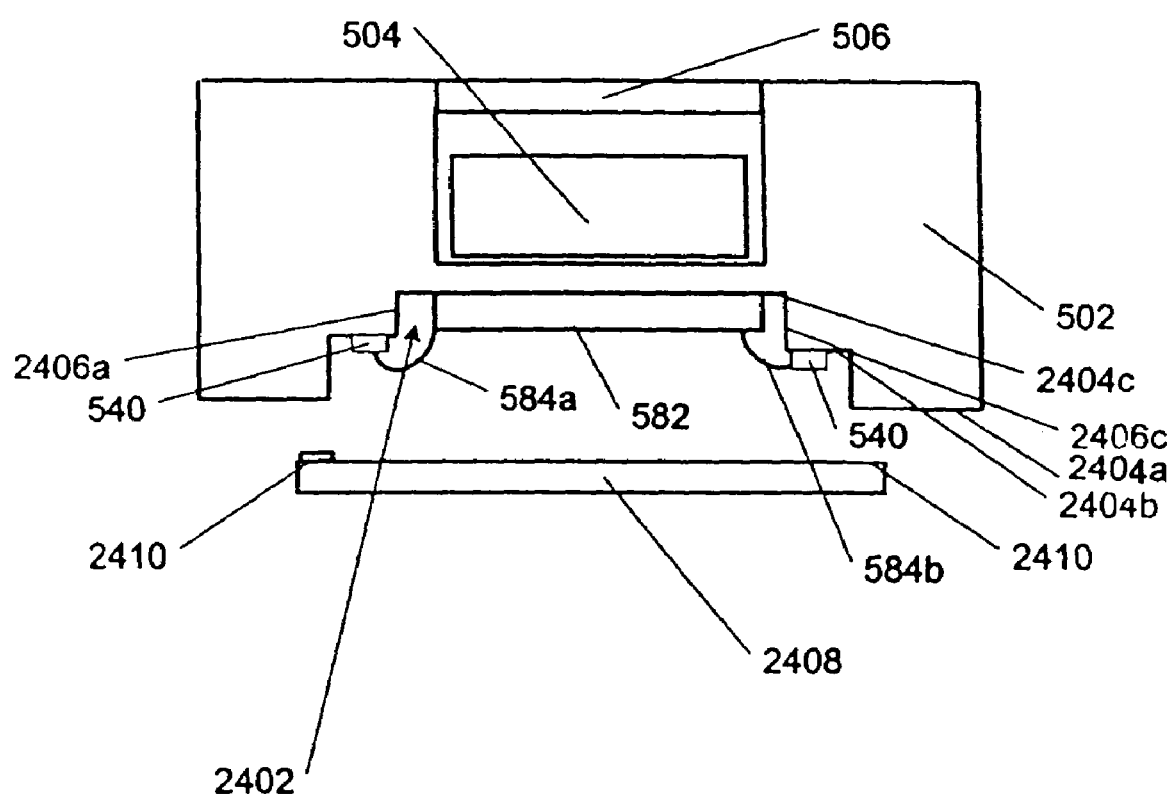
FIG. 23 is a schematic view of an alternate embodiment of the sensor package of FIG. 3.

Referring to FIG. 23, in several alternate embodiments of the sensor package 405, the housings 502, 602, 1302, 1402, 1702 and 1802, as described above, further include a cavity 2402 adapted to receive the controller 582. The housings 502 and 1302 further include one or more external planar surfaces 2404. In one embodiment, there is a first external planar surface 2404a, a second external planar surface 2404b, and a third external planar surface 2404c. The second external planar surface 2404b includes the bond pads 540, 622, 1344, and 1434 as described above. The cavity 2402 includes a first wall 2406a, a second wall 2406b, a third wall 2406c, and a fourth wall 2406d. The first wall 2406a and the third wall 2406c are approximately parallel to each other and the second wall 2406b and the fourth wall 2406d are approximately parallel to each other. The second wall 2406b and the fourth wall 2406d are also perpendicular to the first wall 2406a and the third wall 2406c. The controller 582 may be coupled to the third external planar surface 2404c, for example, by solder or epoxy. The wire bonds 584 couple the controller 582 to the second external planar surface 2404b. A lid 2408 encloses the controller 582, the wire bonds 584, and the cavity 2402. The lid 2408 is coupled to the first external planar surface 2404a. The lid 2408 includes solder preforms 2410. The solder preforms 2410 are coupled to the first external planar surface 2404a using conventional soldering equipment and processes.

Figure 24A:
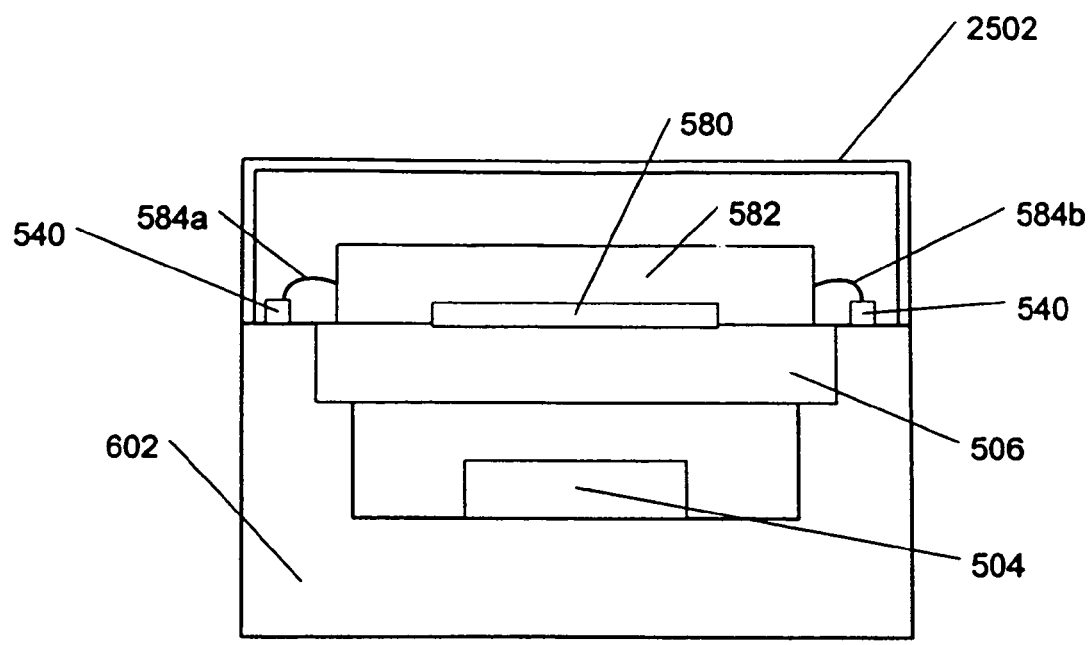
FIG. 24A is a schematic view of an alternate embodiment of the sensor package of FIG. 3.
Figure 24B:
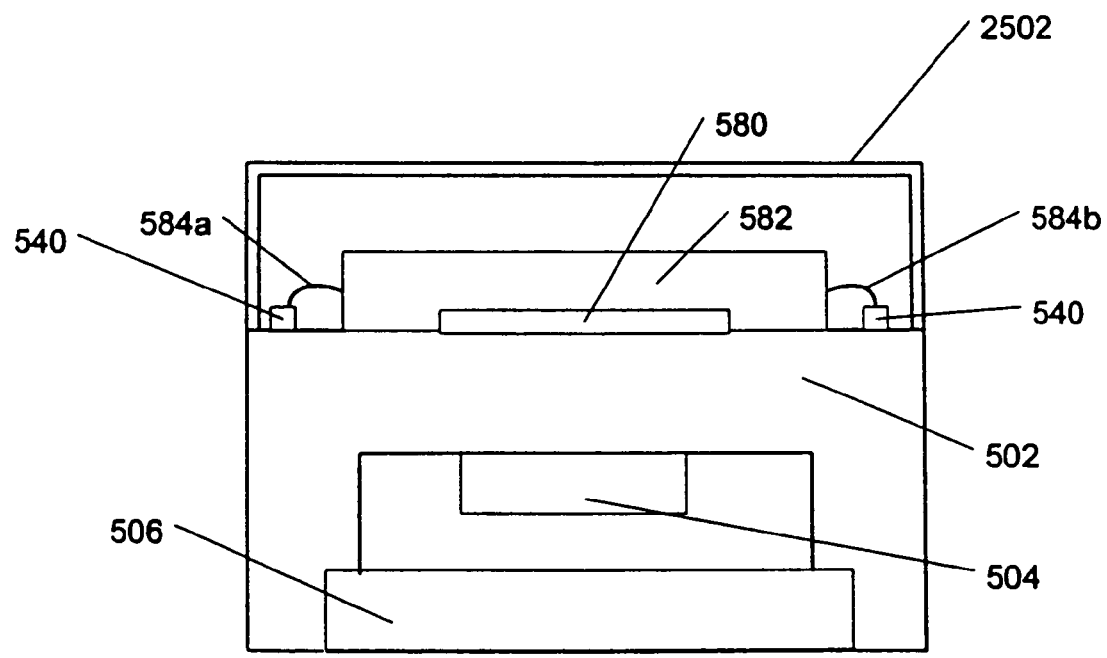
FIG. 24B is a schematic view of an alternate embodiment of the sensor package of FIG. 3.

Referring to FIGS. 24A and 24B, in several alternate embodiments, the controller assembly 508 includes the adhesive 580, the controller 582, the wire bonds 584, and a hermetic cap 2502. The hermetic cap 2502 may be ceramic or metal. In one embodiment, the hermetic cap 2502 is metal to provide good hermetic sealing. The hermetic cap 2502 is coupled to the housings 502, 602, 1302, 1402, 1702 and 1802 as described above. The hermetic cap 2502 may be press-fit, epoxied, soldered or seam-sealed to the housings 502, 602, 1302, 1402, 1702 and 1802. In one embodiment, the hermetic cap 2502 is soldered to the housings 502, 602, 1302, 1402, 1702 and 1802 to provide good hermetic sealing.

Figure 25A:
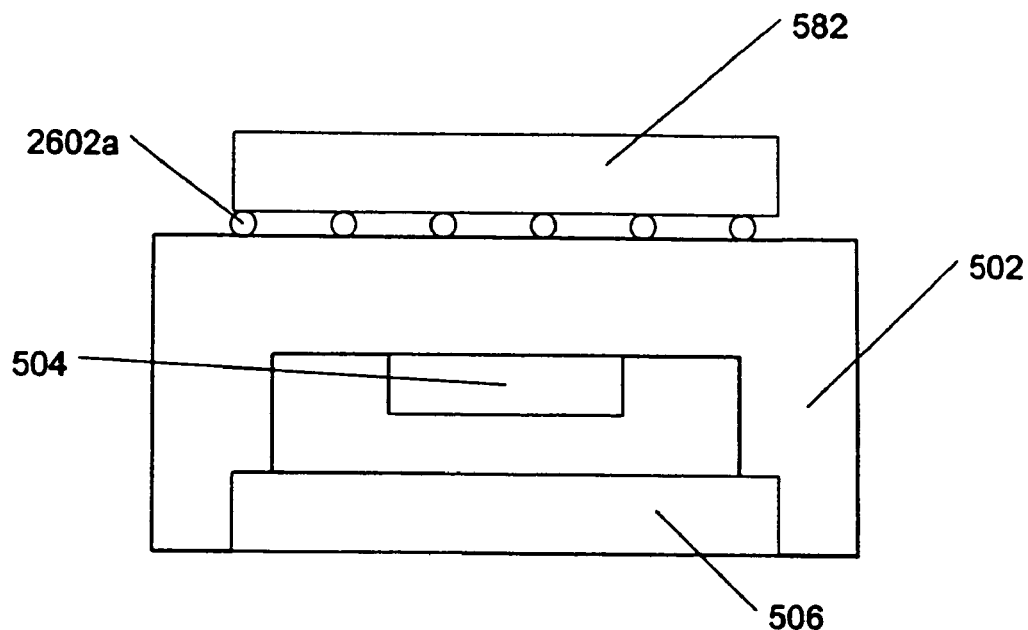
FIG. 25A is a schematic view of an alternate embodiment of the sensor package of FIG. 3.
Figure 25B:
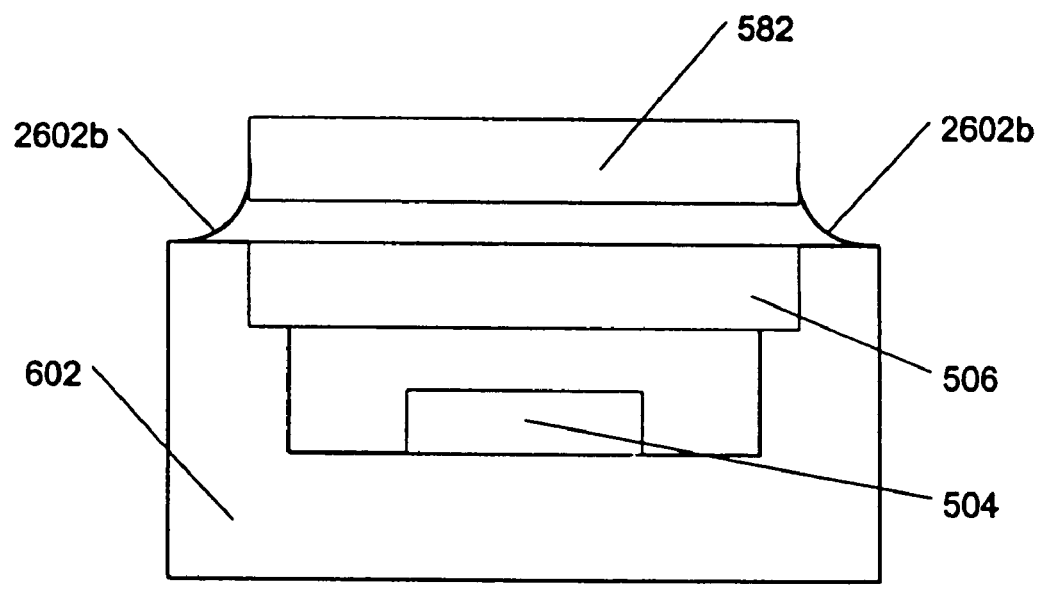
FIG. 25B is a schematic view of an alternate embodiment of the sensor package of FIG. 3.

Referring to FIGS. 25A and 25B, in an alternate embodiment, the sensor package 405 includes the controller 582 coupled to the housings 502, 602, 1302, 1402, 1702 and 1802, as described above by one or more connections 2602. The connections 2602 may be leads, solder, conductive epoxy, or ball-grid arrays. The controller 582 is an integrated chip industry-standard package such as ceramic or plastic.

Figure 26A:
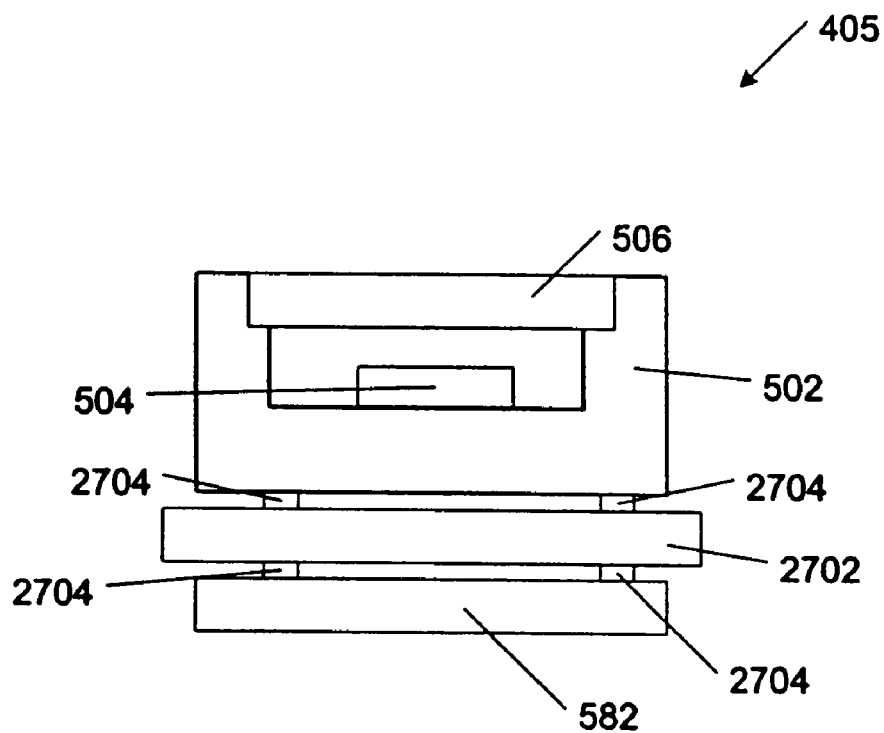
FIG. 26A is a schematic view of an alternate embodiment of the sensor package of FIG. 3.
Figure 26B:
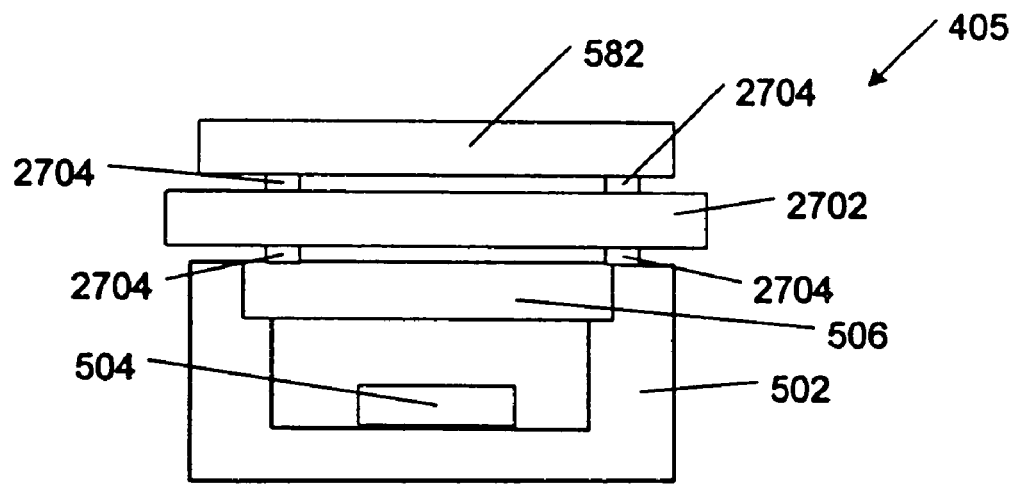
FIG. 26B is a schematic view of an alternate embodiment of the sensor package of FIG. 3.

Referring to FIGS. 26A and 26B, in an alternate embodiment, the sensor package 405 includes a substrate 2702. The controller 582 is coupled to the substrate 2702. The substrate 2702 is coupled to the controller 582 by one or more electrical attachments 2704. The substrate 2702 may be ceramic or organic. The substrate 2702 is also coupled to the housings 502, 602, 1302, 1402, 1702, and 1802, as described above by one or more electrical attachments 2704. The electrical attachments 2704 may be leads, solder, conductive epoxy, or ball grid arrays. The controller 582 may be an application specific integrated circuit die or an integrated chip industry standard package with connections. The integrated chip industry standard package may be ceramic or plastic. The solder attachments 2704 may be, for example, leads, solder, conductive epoxy, or ball-grid arrays. The substrate 2702 further includes conventional leads, connectors or solder joints.

In an alternate embodiment, the substrate 2702 further includes circuit components. The circuit components may be, for example, filtering capacitors, resistors, or active components. In one embodiment, the circuit components are filtering capacitors to provide reduced system 100 size.

In several alternate embodiments, the housings 502 and 602, as described above with reference to FIGS. 4A and 5A, include one or more recesses 1326, for receiving one or more resilient couplings substantially as described above with reference to FIG. 12.

In several alternate embodiments, the cavities 516, 604, 1308, 1404, 1708, and 1804, as described above may be further filled with other materials such as gels or molded plastics.

In several alternate embodiments, splitting the resilient attachment of the sensor 504, 902, and 1304, as described above with reference to FIGS. 4A, 8, and 12, to the housing 502, 602, 1302, and 1402, as described above with reference to FIGS. 4A, 5A, 12, and 13, reduces the stress from the attachment.

In several alternate embodiments, the resilient couplings 512, 904, and 1306, as described above with reference to FIGS. 4A, 8 and 12, are split into one or more pieces by splitting solder preform, conductive epoxy, non-conductive epoxy, or glass frit. The splitting may be done by any conventional splitting method.

In several alternate embodiments, the resilient couplings 512, 904, and 1306 as described above with reference to FIGS. 4A, 8 and 12, further electrically couple the respective sensors 504, 902, and 1304 to the housings 502, 602, 1302, and 1402, as described above with reference to FIGS. 4A, 8, 12, and 13.

In several alternate embodiments, the housings 502, 602, 1302, and 1402, as described above with reference to FIGS. 4A, 5A, 12, and 13, are any conventional substrate.

In several alternate embodiments, the sensor packages 405 size is reduced by vertically stacking the components of the sensor packages 405.

In several alternate embodiments, the sensor packages 405 performance is improved by reducing the communication path length between the controller assembly 508 and the sensors 504, 902, and 1304, as substantially described above with reference to FIGS. 4A through 26B. The performance improvement may be reduced parasitic capacitance, resistance, or inductance.

Although illustrative embodiments of the invention have been shown and described, a wide range of modification, changes and substitution is contemplated in the foregoing disclosure. In some instances, some features of the present invention may be employed without a corresponding use of the other features. Accordingly, it is appropriate that the appended claims be construed broadly and in a manner consistent with the scope of the invention.

The invention claimed is:

1. An integrated sensor apparatus comprising:
 a sensor module including:
 (a) a housing including a cavity, one or more parallel planar surfaces, a bottom surface of the cavity, a bottom exterior surface, a top exterior surface, one or more side surfaces, one or more bond pads on one or more of the parallel planar surfaces, one or more bond pads on the bottom exterior surface, one or more bond pads on the top exterior surface, and one or more bond pads on one or more of the side surfaces;
 (b) a plurality of sensor packages coupled to a substrate in the housing having slots for receiving the sensor packages, each sensor package having an axis of sensitivity positioned in a different spatial direction; wherein each sensor package has a sensor in the cavity, the sensor resiliently coupled to the housing with at least one coupling and at least one bumper slidingly supporting the sensor; and
 (c) a controller coupled to the housing for controlling the sensor module.

2. The apparatus of claim 1, wherein the sensor module comprises at least one micro-machined accelerometer.

3. The apparatus of claim 1, wherein the sensor module comprises three micro-machined accelerometers positioned such that the axes of sensitivity are substantially orthogonal to each other.

4. The apparatus of claim 1, wherein the controller includes an application specific integrated circuit.

5. The apparatus of claim 1, wherein the sensor module is a monolithic package selected from a group consisting of i) a hollow frame; ii) a box; iii) a three-dimensional circuit board; iv) a cylinder; and v) a cube.

6. An integrated sensor apparatus comprising:
 (a) a housing including a cavity, one or more parallel planar surfaces, a bottom surface of the cavity, a bottom exterior surface, a top exterior surface, one or more side surfaces, one or more bond pads on one or more of the parallel planar surfaces, one or more bond pads on the bottom exterior surface, one or more bond pads on the top exterior surface, and one or more bond pads on one or more of the side surfaces; and
 (b) a sensor positioned in the housing cavity; wherein the housing cavity further includes one or more resilient couplings for resiliently coupling the sensor to the housing, wherein the one or more resilient couplings further include one or more bumpers for slidingly supporting the sensor.

7. The sensor apparatus of claim 6, wherein the housing cavity includes a bottom surface, and wherein the resilient couplings are coupled to the bottom surface of the cavity.

8. The sensor apparatus of claim 7 wherein the resilient couplings are approximately positioned at one or more ends of the bottom surface of the cavity of the housing.

9. The sensor apparatus of claim 7, wherein the resilient couplings are approximately positioned at the approximate center of the bottom surface of the cavity of the housing.

10. The sensor apparatus of claim 6, wherein the housing cavity includes a bottom surface, and wherein the bottom surface of the cavity further includes a recess in the bottom surface of the cavity for receiving the resilient couplings.

11. The sensor apparatus of claim 10, wherein the resilient couplings are approximately positioned at the approximate center of the recess of the bottom surface of the cavity.

12. An integrated sensor apparatus comprising:
a sensor module housing including a cavity for receiving a sensor, one or more parallel planar surfaces, a bottom surface of the cavity, a bottom exterior surface, a top exterior surface, one or more side surfaces, one or more bond pads on one or more of the parallel planar surfaces, one or more bond pads on the bottom exterior surface, one or more bond pads on the top exterior surface, and one or more bond pads on one or more of the side surfaces;
a plurality of sensor packages coupled to a substrate in the housing, each sensor package having an axis of sensitivity positioned in a different spatial direction; and
a sensor in the cavity of the housing, the cavity further including a bottom surface, wherein one or more bumpers are coupled to the bottom surface of the cavity for slidlingly supporting the sensor in the housing.

13. The sensor apparatus of claim 12, wherein the bumpers include a cross-sectional shape selected from a group consisting of i) approximately square, approximately rectangular, ii) approximately circular, and iii) approximately triangular.

14. The sensor apparatus of claim 1 further comprising one or more bond pads for coupling the sensor to the housing.

15. The sensor apparatus of claim 14, wherein the bond pads cross sectional shape is selected from a group consisting of i) approximately rectangular, ii) approximately circular, iii) approximately oval, iv) approximately tri-oval, v) approximately oct-oval, vi) approximately wavy sided rectangular, vii) approximately oct-pie-wedge, viii) approximately hollow oct-pie-wedge, ix) approximately nine circular, x) approximately starburst, and xi) approximately sunburst.

16. The sensor apparatus module of claim 1 wherein the sensor further includes one or more passive regions at one or more ends of the sensor, wherein the sensor further includes one or more bond pads, and wherein the bond pads may be located at one or more ends in the passive regions.

17. The sensor apparatus of claim 1, wherein the sensor further includes one or more active regions, wherein the sensor further includes one or more bond pads, and wherein the bond pads may be located in the approximate center of the active regions.

18. The sensor apparatus of claim 1, wherein the housing further includes one or more wire bonds;
wherein the sensor further includes one or more parallel planar surfaces;
wherein the housing further includes one or more parallel planar surfaces; and
wherein the wire bonds electrically couple the parallel planar surfaces of the sensor to the parallel planar surfaces of the housing.

19. The sensor apparatus of claim 4, wherein the sensor further includes a mounting member for removably coupling the sensor to the housing.

20. The sensor apparatus of claim 19, wherein the mounting member is a shorting clip.

21. The sensor apparatus of claim 19, further including a spring assembly for removably coupling the mounting member to the housing.

22. The sensor apparatus of claim 1, wherein the controller comprises;
an adhesive for coupling the controller to the housing;
one or more wire bonds for coupling the controller to the housing; and
an encapsulant for encapsulating the controller and wire bonds.

23. The sensor apparatus of claim 22, wherein the controller is placed on one of i) the top exterior surface of the housing, and ii) a bottom exterior surface of the housing.

24. A method of packaging a sensor assembly comprising:
providing a housing;
disposing a sensor module within the housing wherein the sensor module includes a plurality of sensor packages coupled to a substrate having slots for receiving the sensor packages, each sensor package having an axis of sensitivity in a different special direction; wherein each sensor package has a sensor in the cavity, the sensor resiliently coupled to the housing with at least one coupling and at least one bumper slidingly supporting the sensor;
disposing a controller on the housing; and
coupling the controller to the sensor module with an electrical coupling, wherein the controller is subsequently used to control the sensor module, wherein disposing the controller further comprises:
dispensing an adhesive on the housing;
placing the controller onto the adhesive;
curing the adhesive;
wire-bonding the controller to the housing;
encapsulating the controller and the wire bonds with an encapsulant; and
curing the encapsulant.

25. The method of claim 24, wherein the sensor module includes a micro-machined accelerometer.

26. The method of claim 24, wherein the controller includes a plurality of controller bond pads and the housing includes a plurality of bond pads;
wherein wire-bonding the controller to the housing comprises;
soldering a plurality of wires to corresponding controller bond pads; and
soldering a corresponding end of the wires to corresponding housing bond pads.

27. The method of claim 24, wherein the housing includes:
a cavity;
one or more planar surfaces; a top surface;
a bottom surface; and
one or more housing bond pads on the planar surfaces;
wherein the cavity is for receiving the sensor module;
wherein the planar surfaces are for coupling the sensor module, and the controller to the housing; and
wherein the housing bond pads are for coupling the planar surfaces to the controller.

28. The method of claim 27, wherein the housing cavity further includes one or more resilient couplings for resiliently coupling the sensor to the cavity.

29. The method of claim 28, wherein coupling the sensor module to the housing comprises:

placing a spring assembly in the housing cavity;

coupling a mounting member to the sensor module;

placing the sensor module within the housing cavity; and coupling the mounting member to the spring assembly.

30. The method of claim 29, wherein the mounting member is a shorting clip.

31. The method of claim 24, wherein the different spatial directions are orthogonal to each other.

32. The method of claim 24, wherein the sensor packages are coupled to each other.

* * * * *